(12) United States Patent
Nishiuchi et al.

(10) Patent No.: US 8,350,283 B2
(45) Date of Patent: Jan. 8, 2013

(54) SEMICONDUCTOR LIGHT EMITTING DEVICE AND METHOD FOR MANUFACTURING SAME

(75) Inventors: Hideo Nishiuchi, Kanagawa-ken (JP); Kazuhito Higuchi, Kanagawa-ken (JP); Susumu Obata, Kanagawa-ken (JP); Toshiya Nakayama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 61 days.

(21) Appl. No.: 13/152,654

(22) Filed: Jun. 3, 2011

(65) Prior Publication Data

US 2011/0297983 A1 Dec. 8, 2011

(30) Foreign Application Priority Data

Jun. 7, 2010 (JP) ................................. 2010-130519

(51) Int. Cl.
*H01L 33/50* (2010.01)
(52) U.S. Cl. ....................................................... 257/98
(58) Field of Classification Search .................... 257/13, 257/79–103, 918, E31.058, E31.063, E31.115, 257/E25.032, E27.139, E33.023, 458, 656, 257/252–254, 257–258, E33.046, E29.336, 257/E31.036, E31.087–E31.088, E31.061–E31.062; 438/22–47, 69, 493, 503, 507, 956
See application file for complete search history.

(56) References Cited

U.S. PATENT DOCUMENTS

| | | | |
|---|---|---|---|
| 7,141,825 B2* | 11/2006 | Horio et al. ....................... 257/79 |
| 7,646,036 B2* | 1/2010 | Kozawa et al. ................... 257/99 |
| 2006/0273335 A1* | 12/2006 | Asahara et al. .................. 257/98 |
| 2008/0237620 A1* | 10/2008 | Shiue et al. ...................... 257/98 |
| 2009/0146165 A1 | 6/2009 | Hasnain et al. |
| 2009/0159902 A1* | 6/2009 | Yasuda et al. ................... 257/88 |
| 2010/0012956 A1* | 1/2010 | Yoo ................................... 257/94 |
| 2011/0073889 A1 | 3/2011 | Sugizaki et al. |
| 2011/0220948 A1* | 9/2011 | Yoo ................................... 257/98 |

(Continued)

FOREIGN PATENT DOCUMENTS

JP 2000-114595 A 4/2000

(Continued)

OTHER PUBLICATIONS

Korean Office Action issued Jul. 9, 2012, in Korea Patent Application No. 10-2011-53820 (with English Translation).

(Continued)

*Primary Examiner* — Dao H Nguyen
*Assistant Examiner* — Tram H Nguyen
(74) *Attorney, Agent, or Firm* — Oblon, Spivak, McClelland, Maier & Neustadt, L.L.P.

(57) ABSTRACT

According to one embodiment, a semiconductor light emitting device includes a light emitting unit, first and second conductive members, an insulating layer, a sealing member, and an optical layer. The light emitting unit includes a semiconductor stacked body and first and second electrodes. The semiconductor stacked body includes first and second semiconductor layers and a light emitting layer, and has a major surface on a second semiconductor layer side. The first and second electrodes are connected to the first and second semiconductor layers on the major surface side, respectively. The first conductive member is connected to the first electrode and includes a first columnar portion covering a portion of the second semiconductor. The insulating layer is provided between the first columnar portion and the portion of the second semiconductor. The sealing member covers side surfaces of the conductive members. The optical layer is provided on the other major surface.

18 Claims, 13 Drawing Sheets

U.S. PATENT DOCUMENTS

| | | | |
|---|---|---|---|
| 2011/0266560 A1* | 11/2011 | Yao et al. | 257/88 |
| 2011/0291141 A1* | 12/2011 | Sorimachi | 257/98 |
| 2011/0291148 A1 | 12/2011 | Sugizaki et al. | |
| 2011/0297983 A1 | 12/2011 | Nishiuchi et al. | |
| 2011/0297987 A1 | 12/2011 | Koizumi et al. | |
| 2011/0300651 A1 | 12/2011 | Kojima et al. | |

FOREIGN PATENT DOCUMENTS

| | | |
|---|---|---|
| JP | 2001-210874 | 8/2001 |
| JP | 2002-64112 A | 2/2002 |
| JP | 2002-118293 | 4/2002 |
| JP | 2003-7929 | 1/2003 |
| JP | 2009-220434 | 10/2009 |
| JP | 2010-517289 A | 5/2010 |
| JP | 2010-120262 | 6/2010 |
| JP | 2010-126575 | 6/2010 |
| JP | 2010-130521 | 6/2010 |
| JP | 2010-130522 | 6/2010 |
| JP | 2010-130526 | 6/2010 |
| JP | 2010-211175 | 9/2010 |
| JP | 2010-223168 | 10/2010 |
| JP | 2011-5625 | 1/2011 |
| JP | 2011-25812 | 2/2011 |
| JP | 2011-57625 | 3/2011 |
| JP | 2011-64909 | 3/2011 |
| JP | 2011-67906 | 4/2011 |
| JP | 2011-71272 | 4/2011 |
| JP | 2011-258673 | 12/2011 |
| JP | 2011-258674 | 12/2011 |
| JP | 2012-69591 | 4/2012 |
| JP | 2012-78184 | 4/2012 |
| KR | 10-2009-0115156 | 11/2009 |

OTHER PUBLICATIONS

U.S. Appl. No. 13/424,687, filed Mar. 20, 2012, Obata, et al.
Japanese Office Action issued Aug. 13, 2012 in Patent Application No. 2010-130519 with English Translation.

* cited by examiner

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2010-130519, filed on Jun. 7, 2010; the entire contents of which are incorporated herein by reference.

FIELD

Embodiments described herein relate generally to a semiconductor light emitting device and a method for manufacturing the same.

BACKGROUND

White LED (Light Emitting Diode) light emitting devices, which emit white light by a combination of a fluorescer and a semiconductor light emitting element such as a blue LED, have been developed as small and low power-consumption light emitting devices.

For example, a known semiconductor light emitting device has a configuration in which a fluorescer is coated onto an LED chip surface after the LED chip is die bonded to a leadframe or a conductive substrate and wire bonding is performed. However, in such a semiconductor light emitting device, the device is large and downsizing is impeded because members other than the LED chip such as the leadframe, the conductive substrate, the bonding wires, etc., are necessary.

In semiconductor light emitting elements, the surface area of the n-side electrode provided on the n-type semiconductor layer is often set to be smaller than the p-side electrode provided on the p-type semiconductor layer to improve, for example, the heat dissipation and the luminous efficiency. When downsizing the semiconductor light emitting element, for example, the n-type electrode becomes small and it becomes difficult to perform connections.

DETAILED DESCRIPTION

Figure 1A:
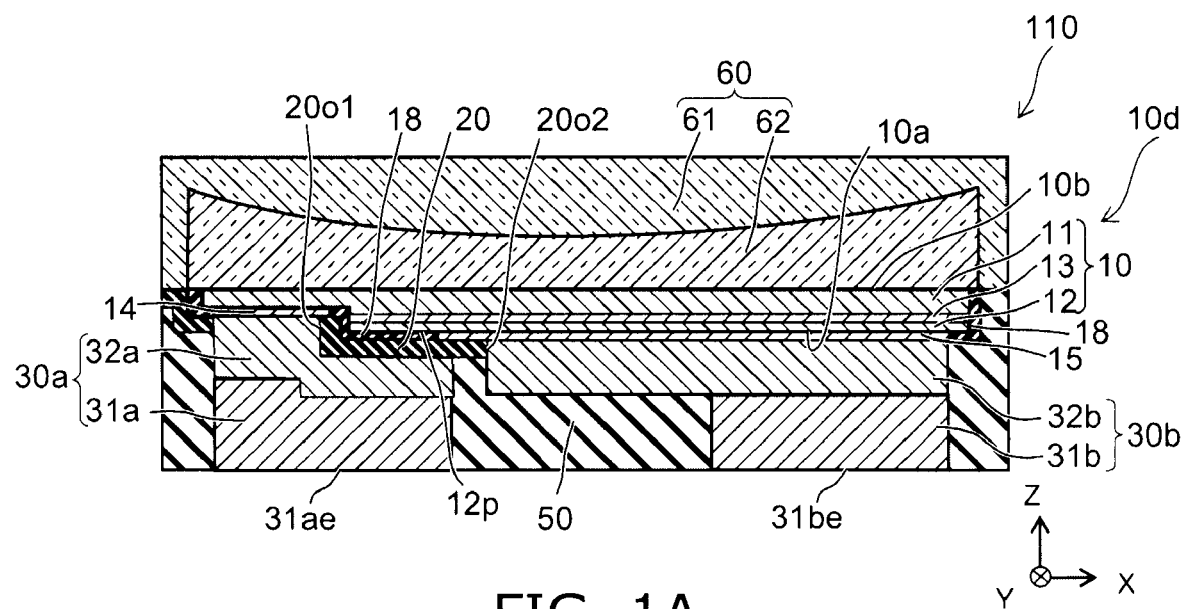
FIG. 1A and FIG. 1B are schematic views illustrating the configuration of a semiconductor light emitting device according to a first embodiment.

In general, according to one embodiment, a semiconductor light emitting device includes a light emitting unit, a first conductive member, an insulating layer, a second conductive member, a sealing member, and an optical layer. The light emitting unit includes a semiconductor stacked body, a first electrode, and a second electrode. The semiconductor stacked body includes a first semiconductor layer of a first conductivity type, a second semiconductor layer of a second conductivity type, and a light emitting layer provided between the first semiconductor layer and the second semiconductor layer. The semiconductor stacked body has a first major surface on a first semiconductor layer side and a second major surface on a second semiconductor layer side. The first electrode is electrically connected to the first semiconductor layer on a second major surface side. The second electrode is electrically connected to the second semiconductor layer on the second major surface side. The first conductive member is electrically connected to the first electrode and includes a first columnar portion provided on the second major surface to cover a portion of the second semiconductor layer on the second major surface side. The first columnar portion is separate from the second semiconductor layer. The insulating layer is provided between the first columnar portion and the portion of the second semiconductor layer on the second major surface side. The second conductive member is electrically connected to the second electrode and includes a second columnar portion provided on the second major surface. The sealing member covers a side surface of the first conductive member and a side surface of the second conductive member. The optical layer is provided on the first major surface of the semiconductor stacked body and includes a wavelength conversion unit configured to absorb an emitted light emitted from the light emitting layer and emit light having a wavelength different from a wavelength of the emitted light.

According to another embodiment, a method is disclosed for manufacturing a semiconductor light emitting device. The semiconductor light emitting device includes a light emitting unit, a first conductive member, an insulating layer, a second conductive member, a sealing member, and an optical layer. The light emitting unit includes a semiconductor stacked body, a first electrode, and a second electrode. The semiconductor stacked body includes a first semiconductor layer of a first conductivity type, a second semiconductor layer of a second conductivity type, and a light emitting layer provided between the first semiconductor layer and the second semiconductor layer. The semiconductor stacked body has a first major surface on a first semiconductor layer side and a second major surface on a second semiconductor layer side. The first electrode is electrically connected to the first semiconductor layer on a second major surface side. The second electrode is electrically connected to the second semiconductor layer on the second major surface side. The first conductive member is electrically connected to the first electrode. The first conductive member includes a first columnar portion provided on the second major surface to cover a portion of the second semiconductor layer on the second major surface side. The first columnar portion is separate from the second semiconductor layer. The insulating layer is provided between the first columnar portion and the portion of the second semiconductor layer on the second major surface side. The second conductive member is electrically connected to the second electrode and includes a second columnar portion provided on the second major surface. The sealing member covers a side surface of the first conductive member and a side surface of the second conductive member. The optical layer is provided on the first major surface of the semiconductor stacked body and includes a wavelength conversion unit configured to absorb an emitted light emitted from the light emitting layer and emit light having a wavelength different from a wavelength of the emitted light. The method can include forming the insulating layer to cover the portion of the second semiconductor layer on the second major surface side. In addition, the method can include forming a conductive film on the insulating layer covering the portion of the second semiconductor layer on the second major surface side. The conductive film is used to form at least a portion of the first conductive member.

Embodiments of the invention will now be described with reference to the drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

Figure 1B:
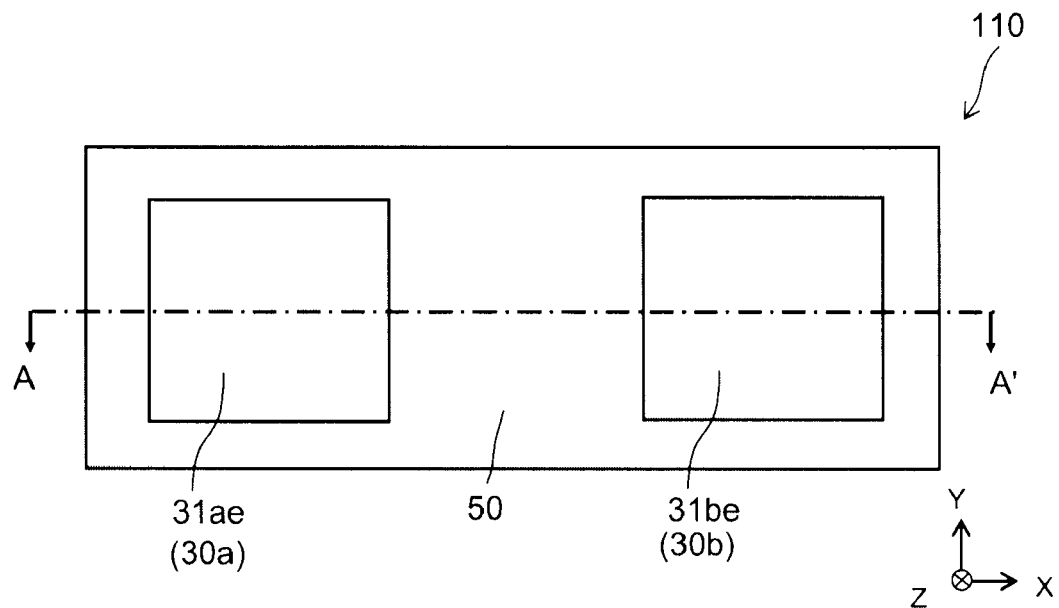

FIG. 1A and FIG. 1B are schematic views illustrating the configuration of a semiconductor light emitting device according to a first embodiment.

Namely, FIG. 1B is a schematic plan view; and FIG. 1A is a cross-sectional view along line A-A' of FIG. 1B.

As illustrated in FIG. 1A and FIG. 1B, the semiconductor light emitting device 110 according to this embodiment includes a light emitting unit 10d, a first conductive member 30a, a second conductive member 30b, an insulating layer 20, a sealing member 50, and an optical layer 60.

The light emitting unit 10d includes a semiconductor stacked body 10, a first electrode 14, and a second electrode 15.

The semiconductor stacked body 10 includes a first semiconductor layer 11 of a first conductivity type, a second semiconductor layer 12 of a second conductivity type, and a light emitting layer 13 provided between the first semiconductor layer 11 and the second semiconductor layer 12.

In the semiconductor stacked body 10, a portion of the first semiconductor layer 11 at a second major surface 10a on the second semiconductor layer 12 side is exposed by the second semiconductor layer 12 and the light emitting layer 13 being selectively removed.

In other words, the semiconductor stacked body 10 includes a first major surface 10b and the second major surface 10a on the side opposite to the first major surface 10b. The second semiconductor layer 12 is disposed on the second major surface 10a side; and the first semiconductor layer 11 is disposed on the first major surface 10b side. The surface areas of the second semiconductor layer 12 and the light emitting layer 13 are smaller than the surface area of the first semiconductor layer 11; and a portion of the first semiconductor layer 11 on the second major surface 10a side is not covered with the second semiconductor layer 12 and the light emitting layer 13.

The first conductivity type is, for example, an n type; and the second conductivity type is, for example, a p type. However, the embodiment is not limited thereto. The first conductivity type may be the p type; and the second conductivity type may be the n type. Hereinbelow, the case is described where the first conductivity type is the n type and the second conductivity type is the p type. In other words, the first semiconductor layer 11 is an n-type semiconductor layer. The second semiconductor layer 12 is a p-type semiconductor layer.

The first semiconductor layer 11, the second semiconductor layer 12, and the light emitting layer 13 may include, for example, a nitride semiconductor. The first semiconductor layer 11 is, for example, an n-type clad layer including GaN. The second semiconductor layer 12 is, for example, a p-type clad layer. The light emitting layer 13 includes, for example, a quantum well layer and a barrier layer stacked with the quantum well layer. The light emitting layer 13 may include, for example, a single quantum well structure or a multiple quantum well structure.

Herein, a direction from the second major surface 10a toward the first major surface 10b is taken as a Z-axis direction. In other words, the Z-axis direction is the stacking direction of the first semiconductor layer 11, the light emitting layer 13, and the second semiconductor layer 12. One direction perpendicular to the Z-axis direction is taken as an X-axis direction. A direction perpendicular to the Z-axis direction and the X-axis direction is taken as a Y-axis direction.

The semiconductor stacked body 10 is formed by, for example, sequentially growing a crystal used to form the first semiconductor layer 11, a crystal used to form the light emitting layer 13, and a crystal used to form the second semiconductor layer 12 on a substrate such as sapphire and subsequently removing a portion of the first semiconductor layer 11, the light emitting layer 13, and the second semiconductor layer 12 in a prescribed region.

The first electrode 14 is electrically connected to the first semiconductor layer 11 on the second major surface 10a side. The second electrode 15 is electrically connected to the second semiconductor layer 12 on the second major surface 10a side. The first electrode 14 is, for example, an n-side electrode; and the second electrode 15 is, for example, a p-side electrode. Light (an emitted light) is emitted from the light emitting layer 13 of the light emitting unit 10d by supplying a current to the semiconductor stacked body 10 via the first electrode 14 and the second electrode 15.

Thus, the light emitting unit 10d includes the first major surface 10b, the second major surface 10a on the side opposite to the first major surface 10b, and the first electrode 14 and the second electrode 15 provided on the second major surface 10a.

The first conductive member 30a is electrically connected to the first electrode 14. The first conductive member 30a includes a first columnar portion 31a. The first columnar portion 31a is provided on the second major surface 10a to cover a portion (a certain portion 12p) of the second semiconductor layer 12 on the second major surface 10a side while being separate from the second semiconductor layer 12. The first columnar portion 31a includes at least a portion extending along, for example, the Z-axis direction.

The insulating layer 20 is provided between the first columnar portion 31a and the certain portion 12p of the second semiconductor layer 12 on the second major surface 10a side recited above. The second semiconductor layer 12 and the first columnar portion 31a are electrically cut off from each other by the insulating layer 20.

The insulating layer 20 is not provided on at least a portion of the first electrode 14 to realize the electrical connection between the first conductive member 30a and the first electrode 14. The insulating layer 20 has, for example, a first opening 20o1; and the electrical connection between the first conductive member 30a and the first electrode 14 is performed in the first opening 20o1. The first opening 20o1 may include a hole piercing the insulating layer 20. However, the embodiment is not limited thereto. For convenience, the first opening 20o1 may include the case where the end portion of the insulating layer 20 includes a portion receded from the end portion of the first electrode 14 to expose the first electrode 14. In other words, the first opening 20o1 may include the case where a portion of the insulating layer 20 leaves at least a portion of the first electrode 14 exposed; and the configuration thereof is arbitrary. The number of the first openings 20o1 is arbitrary.

The second conductive member 30b is electrically connected to the second electrode 15. The second conductive member 30b includes a second columnar portion 31b provided on the second major surface 10a. The second columnar portion 31b includes at least a portion extending along the Z-axis direction.

In this specific example, the direction of the side of the semiconductor stacked body 10 along the direction from the first columnar portion 31a toward the second columnar portion 31b is set to be in the X-axis direction.

The insulating layer 20 also leaves at least a portion of the second electrode 15 exposed. Thereby, the electrical connection between the second conductive member 30b and the second electrode 15 is performed. In other words, the insulating layer 20 has, for example, a second opening 20o2 on the second electrode 15 side; and the electrical connection between the second conductive member 30b and the second electrode 15 is performed in the second opening 20o2. In such a case as well, the second opening 20o2 includes a hole piercing the insulating layer 20. Also, for convenience, the second opening 20o2 may include a portion receded from the end portion of the second electrode 15 to expose the second electrode 15. In other words, the second opening 20o2 may include the case where a portion of the insulating layer 20 leaves at least a portion of the second electrode 15 exposed; and the configuration thereof is arbitrary. The number of the second openings 20o2 is arbitrary.

The sealing member 50 covers the side surface of the first conductive member 30a and the side surface of the second conductive member 30b. In other words, the sealing member 50 covers the side surface of the first columnar portion 31a and the side surface of the second columnar portion 31b. The sealing member 50 leaves exposed a first end surface 31ae on the side of the first conductive member 30a opposite to the semiconductor stacked body 10. The sealing member 50 also leaves exposed a second end surface 31be on the side of the second conductive member 30b opposite to the semiconductor stacked body 10. The first end surface 31ae is the end surface on the side of the first columnar portion 31a opposite to the semiconductor stacked body 10. The second end surface 31be is the end surface on the side of the second columnar portion 31b opposite to the semiconductor stacked body 10.

The optical layer 60 is provided on the first major surface 10b on the side of the semiconductor stacked body 10 opposite to the second major surface 10a. The optical layer 60 includes a fluorescer layer 61 (a wavelength conversion unit). The fluorescer layer 61 is configured to absorb emitted light emitted from the light emitting layer 13 and emit light having a wavelength different from the wavelength of the emitted light.

In this specific example, the optical layer 60 includes, for example, the fluorescer layer 61 including a fluorescer and a transparent member 62 provided between the fluorescer layer 61 and the semiconductor stacked body 10. The transparent member 62 is transparent to the emitted light emitted from the light emitting layer 13. The transparent member 62 may have an effect of changing the propagation direction of the light such as, for example, a lens effect and/or a refraction effect. Thereby, the irradiation angle and the color shift of the light produced by the light emitting layer 13 can be adjusted. The transparent member 62 may be provided if necessary; and the transparent member 62 can be omitted in some cases.

The fluorescer layer 61 includes, for example, a transparent resin and a fluorescer dispersed in the resin. The fluorescer is configured to absorb the emitted light emitted from the light emitting layer 13 and emit light having a wavelength different from the wavelength of the emitted light. The fluorescer layer 61 may include multiple types of fluorescers. The fluorescer may include a fluorescer configured to emit any color such as, for example, a fluorescer configured to emit yellow light, a fluorescer configured to emit green light, and a fluorescer configured to emit red light. The fluorescer layer 61 also may include multiple stacked layers including fluorescers of different wavelengths.

In the semiconductor light emitting device 110, a current is supplied to the semiconductor stacked body 10 via the first conductive member 30a, the first electrode 14, the second conductive member 30b, and the second electrode 15. Thereby, the light (the emitted light) is emitted from the light emitting layer 13. The emitted light may be light having a relatively short wavelength such as, for example, blue light, violet light, and ultraviolet light.

For example, blue light emitted from the light emitting layer 13 propagates through the interior of the optical layer 60; and its wavelength is converted into, for example, yellow light by the fluorescer layer 61. Then, for example, the blue emitted light emitted from the light emitting layer 13 synthesizes with, for example, the yellow light obtained in the fluorescer layer 61. Thereby, the semiconductor light emitting device 110 can emit white light.

The wavelength of the emitted light emitted from the light emitting layer 13 and the wavelength of the light converted in the fluorescer layer 61 are arbitrary. Other than white, the color of the light emitted from the semiconductor light emitting device 110 may be any color.

In this specific example, the light emitting unit 10d further includes a protective layer 18 provided on a portion of the semiconductor stacked body 10 on the second major surface 10a side excluding the first electrode 14 and the second electrode 15. The protective layer 18 covers the end portion of the semiconductor stacked body 10. The protective layer 18 may include an insulating material. Thereby, the insulative property between, for example, the first electrode 14 and the second electrode 15 improves. The protective layer 18 also may cover the entire end portion of the semiconductor stacked body 10. The protective layer 18 also may cover a portion of the end portion of the semiconductor stacked body 10. The protective layer 18 may include, for example, silicon oxide, etc. However, the embodiment is not limited thereto. The protective layer 18 may include any insulating material. The protective layer 18 may be provided if necessary and may be omitted in some cases.

The second electrode 15 may have a stacked structure. For example, the second electrode 15 may include a conductive layer and a reflective layer (not illustrated) provided between the conductive layer and the second semiconductor layer 12. Thereby, the light that is emitted from the light emitting layer 13 and propagates to the second major surface 10a side is reflected by the reflective layer; and light can efficiently propagate to the optical layer 60 side.

In this specific example, the first conductive member 30a further includes a first connection portion 32a. The first connection portion 32a covers at least a portion of the insulating layer 20 and electrically connects the first electrode 14 to the first columnar portion 31a. The first connection portion 32a may include, for example, a portion extending along the X-Y plane.

The second conductive member 30b may further include a second connection portion 32b. The second connection portion 32b electrically connects the second electrode 15 to the second columnar portion 31b. The second connection portion 32b may include, for example, a portion extending along the X-Y plane.

The first columnar portion 31a, the first connection portion 32a, the second columnar portion 31b, and the second connection portion 32b may include a metal such as, for example, Cu (copper), Ni (nickel), Al (aluminum), etc. However, the embodiment is not limited thereto. The first columnar portion 31a, the first connection portion 32a, the second columnar portion 31b, and the second connection portion 32b may include any material.

The sealing member 50 covers the side surface of the first connection portion 32a, the side surface of the first columnar portion 31a, the side surface of the second connection portion 32b, and the side surface of the second columnar portion 31b. The sealing member 50 may include a resin such as, for example, an epoxy resin. The resin of the sealing member 50 may contain a filler such as, for example, a quartz filler, an alumina filler, etc. Thereby, the thermal conductivity of the sealing member 50 can be increased. Thereby, the heat dissipation can be improved; the temperature increase of the semiconductor stacked body can be suppressed; and the luminous efficiency can be increased.

The insulating layer 20 provided between the first columnar portion 31a and the certain portion 12p of the second semiconductor layer 12 on the second major surface 10a side recited above may include a resin such as, for example, polyimide.

In the semiconductor light emitting device 110, a configuration is employed in which the first columnar portion 31a of the first conductive member 30a covers a portion of the second semiconductor layer 12 with the insulating layer 20 interposed. Thereby, the surface area of the end surface (the first end surface 31ae) on the side of the first columnar portion 31a opposite to the semiconductor stacked body 10 is set to be greater than the surface area of the first electrode 14.

To obtain a high heat dissipation and a high luminous efficiency in the light emitting unit 10d, the surface area of one of the two electrodes provided in the semiconductor stacked body 10 is set to be large; and the other is set to be small. In this specific example, the surface area of the first electrode 14 connected to the first semiconductor layer 11 of the n-type semiconductor (the surface area of the first electrode 14 as viewed from the Z-axis direction) is set to be smaller than the surface area of the second electrode 15 connected to the second semiconductor layer 12 of the p-type semiconductor (the surface area of the second electrode 15 as viewed from the Z-axis direction).

On the other hand, the electrical connection between the outside of the semiconductor light emitting device 110 and the semiconductor light emitting device 110 is performed via the first conductive member 30a and the second conductive member 30b.

Therefore, to obtain good connectability in the semiconductor light emitting device 110, it is desirable for the surface area of the first end surface 31ae of the first conductive member 30a exposed from the sealing member 50 and the surface area of the second end surface 31be of the second conductive member 30b exposed from the sealing member 50 to be as large as possible. Also, it is desirable for the spacing between the first end surface 31ae and the second end surface 31be to be set to be wide with a length (e.g., the length of the side along the X-axis direction) of about, for example, the length of the side of the first end surface 31ae.

In the case where the semiconductor light emitting device 110 is downsized and the exterior form thereof (in particular, the surface area of the surface parallel to the X-Y plane) is reduced, it is important to maintain good connectability.

For example, in a comparative example in which the surface area of the first electrode 14 connected to the first semiconductor layer 11 of the n-type semiconductor is set to be smaller than the surface area of the second electrode 15 connected to the second semiconductor layer 12 of the p-type semiconductor and the surface area of the first end surface 31ae of the first conductive member 30a connected to the first electrode 14 is as small as the surface area of the first electrode 14, there are cases where the connectability degrades. Therefore, connection defects occur easily. Easy degradation of the connectability impedes the downsizing of the semiconductor light emitting device 110.

In the semiconductor light emitting device 110 according to this embodiment, the first columnar portion 31a of the first conductive member 30a connected to the first electrode 14 for the first semiconductor layer 11 covers the certain portion 12p of the second semiconductor layer 12 on the second major surface 10a side while being separate from the second semiconductor layer 12. Thereby, the cross-sectional area (the cross-sectional area when cut by the X-Y plane) of the first columnar portion 31a can be greater than the surface area of the first electrode 14. Then, the first columnar portion 31a and the second semiconductor layer 12 are electrically cut off from each other by the insulating layer 20 provided between the first columnar portion 31a and the certain portion 12p of the second semiconductor layer 12 on the second major surface 10a side. By employing such a configuration, even in the case where the surface area of the first electrode 14 is small, the surface area of the first end surface 31ae of the first columnar portion 31a (the first conductive member 30a) connected to the first electrode 14 can be large and good connectability can be realized.

Thus, according to the semiconductor light emitting device 110 according to this embodiment, high electrode connectability can be maintained; and a semiconductor light emitting device suited to downsizing can be provided.

The effects of such a configuration are realized particularly effectively in the case where the semiconductor light emitting device 110 is downsized and the exterior form thereof (in particular, the surface parallel to the X-Y plane) is reduced. These are realized particularly effectively in the case where the surface area of the first electrode 14 is less than the surface area of the second electrode 15.

In the case where the semiconductor light emitting device 110 is mounted, for example, on a printed wiring board, it is desirable for the spacing between the first end surface 31ae and the second end surface 31be to be, for example, not less than 200 micrometers (μm) due to the precision of the wiring technology of printed wiring boards for mass production. However, the embodiment is not limited thereto. The spacing between the first end surface 31ae and the second end surface 31be is arbitrary.

It is desirable for the distance from the side surface of the first conductive member 30a to the exterior surface of the semiconductor light emitting device 110 and the distance from the side surface of the second conductive member 30b to the exterior surface of the semiconductor light emitting device 110 to be, for example, not less than the diameter of the filler included in the resin of the sealing member 50. For example, it is desirable for the distance from the first end surface 31ae to the exterior surface (the surface along the Z-axis direction) of the semiconductor light emitting device 110 and the distance from the second end surface 31be to the exterior surface (the surface along the Z-axis direction) of the semiconductor light emitting device 110 to be not less than, for example, 50 μm for a general thermosetting resin. However, the embodiment is not limited thereto. The distance from the first end surface 31ae to the exterior surface of the semiconductor light emitting device 110 and the distance from the second end surface 31be to the exterior surface of the semiconductor light emitting device 110 are arbitrary.

The size of the surface of the semiconductor light emitting device 110 parallel to the X-Y plane can be the minimum size of a bottom surface electrode-type electronic part. For example, the surface of the semiconductor light emitting device 110 parallel to the X-Y plane may be a 600 μm by 300 μm rectangle. For example, the exterior form of the semiconductor light emitting device 110 may be a 600 μm by 300 μm by 300 μm rectangular parallelepiped. Also, the surface of the semiconductor light emitting device 110 parallel to the X-Y plane may be a 1000 μm by 500 μm rectangle. For example, the exterior form of the semiconductor light emitting device 110 may be a 1000 μm by 500 μm by 500 μm rectangular parallelepiped. However, the embodiment is not limited thereto. The size and the configuration of the surface of the semiconductor light emitting device 110 parallel to the X-Y plane and the size and the configuration of the semiconductor light emitting device 110 are arbitrary.

In the semiconductor light emitting device 110 according to this embodiment, the cross-sectional area (the cross-sectional area when cut by the X-Y plane) of the first conductive member 30a (e.g., the first columnar portion 31a) and the second conductive member 30b (e.g., the second columnar portion 31b) may be increased. In other words, the cross sections of the first conductive member 30a and the second conductive member 30b, which are the heat dissipation path of the heat of the light emitting unit 10d, may be increased. By using, for example, a metal having a high thermal conductivity as the first conductive member 30a (e.g., the first columnar portion 31a) and the second conductive member 30b (e.g., the second columnar portion 31b), the thermal resistance of the heat dissipation path of the heat generated in the semiconductor stacked body 10 is reduced; and the heat dissipation is improved.

The electrical connection between the semiconductor light emitting device 110 and, for example, a printed wiring board connected to the semiconductor light emitting device 110 may be performed by connecting the first end surface 31ae of the first conductive member 30a to an electrode of the printed wiring board and by connecting the second end surface 31be of the second conductive member 30b to an electrode of the printed wiring board using, for example, a solder material. The thermal conductivity of the solder material is small, e.g., about ⅟₇ of the thermal conductivity of the copper of the first conductive member 30a and the second conductive member 30b. Therefore, to improve the heat dissipation, it is effective to increase the cross-sectional area of the solder bond portion.

In the semiconductor light emitting device 110 according to this embodiment, the cross-sectional area of the solder bond portion can be increased because the surface area of the first end surface 31ae of the first conductive member 30a and the surface area of the second end surface 31be of the second conductive member 30b can be increased. Therefore, the heat dissipation can be improved by the configuration of the semiconductor light emitting device 110.

The thickness of the semiconductor stacked body 10 is thin, e.g., not less than about 5 μm and not more than about 6 μm; and the thermal conductivity of the semiconductor stacked body 10 is lower than that of metal. Therefore, a portion of the heat generated at the light emitting layer 13 is conducted in the direction along the X-Y plane through the semiconductor stacked body 10; heat easily accumulates in the semiconductor stacked body 10; and the temperature in the light emitting layer 13 easily increases.

At this time, in the semiconductor light emitting device 110 according to this embodiment, the heat generated in the semiconductor stacked body 10 can be conducted efficiently in the Z-axis direction and the X-Y planar direction and the temperature increase of the light emitting layer 13 can be suppressed by providing the second conductive member 30b, which has a high thermal conductivity, at a position opposing the light emitting layer 13 (i.e., a position opposing the second semiconductor layer 12). Further, the temperature of the light emitting layer 13 can be more uniform.

The heat dissipation effects increase as the cross-sectional area of the heat conduction path of the first conductive member 30a and the second conductive member 30b increases. For example, the heat dissipation effects increase as the cross-sectional area of the first columnar portion 31a (the cross-sectional area when the first columnar portion 31a is cut by the X-Y plane) and the cross-sectional area of the second columnar portion 31b (the cross-sectional area when the second columnar portion 31b is cut by the X-Y plane) increase. In the case where the first connection portion 32a and the second connection portion 32b are provided, the heat dissipation effects increase as the thicknesses of the first connection portion 32a and the second connection portion 32b (the thicknesses along the Z-axis direction) increase.

Thus, according to the semiconductor light emitting device 110 according to this embodiment, the heat dissipation can be improved further; the luminous efficiency can be increased more; and the reliability can be increased more.

An example of the configuration of the semiconductor light emitting device 110 will now be described further.

The length of the side of the semiconductor light emitting device 110 along the X-axis direction may be, for example, 600 μm. The length of the side of the semiconductor light emitting device 110 along the Y-axis direction may be, for example, 300 μm. An example of a configuration will now be described for the case where the length of the side of the semiconductor light emitting device 110 along the X-axis direction is 600 μm and the length of the side along the Y-axis direction is 300 μm. The length of the side of the first semiconductor layer 11 along the X-axis direction may be, for example, 570 μm. The length of the side of the first semiconductor layer 11 along the Y-axis direction may be, for example, 270 μm.

The X-axis direction is taken to be the direction of the side of the semiconductor stacked body 10 along the direction from the first columnar portion 31a toward the second columnar portion 31b.

The length of the semiconductor light emitting device 110 along the X-axis direction (the direction from the first columnar portion 31a toward the second columnar portion 31b) may be set to be longer than the length of the semiconductor light emitting device 110 along the Y-axis direction (the direction orthogonal to the direction from the first columnar portion 31a toward the second columnar portion 31b and the direction from the second major surface 10a toward the first major surface 10b).

The length of the first semiconductor layer 11 along the X-axis direction may be set to be longer than the length of the first semiconductor layer 11 along the Y-axis direction.

Thereby, the size of the first end surface 31ae and the size of the second end surface 31be can be set to be large in the case where the first end surface 31ae and the second end surface 31be are disposed along the X-axis direction. Thereby, the connectability of the electrodes can be increased further.

The fluorescer layer 61 may include a resin into which, for example, a fluorescer particle configured to absorb light and emit light having a wavelength longer than the wavelength of the absorbed light is mixed. For example, the fluorescer is configured to absorb at least one light selected from blue light, violet light, and ultraviolet light and emit light having a wavelength longer than such light. The resin into which the fluorescer is mixed may include, for example, a silicone resin. The thickness of the fluorescer layer 61 may be, for example, 200 μm. The silicone resin of the fluorescer layer 61 may include, for example, methyl phenyl silicone having a refractive index of about 1.5. However, the embodiment is not limited thereto. The resin and the fluorescer included in the fluorescer layer 61 are arbitrary.

As described above, the second electrode 15 may include a conductive layer and a reflective layer provided between the conductive layer and the second semiconductor layer 12. The reflective layer may contain at least one selected from, for example, Ag and Al. The thickness of the reflective layer may be, for example, 0.3 μm. The reflective layer may be provided in the region of substantially the entire second semiconductor layer 12 on the second major surface 10a side. Thereby, the emitted light emitted from the light emitting layer 13 can be reflected efficiently toward the first major surface 10b. However, the region where the reflective layer is provided is arbitrary. For example, the reflective layer may be provided in the region of a portion of the second semiconductor layer 12 on the second major surface 10a side.

The second electrode 15 may further include a contact electrode layer provided between the reflective layer recited above and the second semiconductor layer 12. The contact electrode layer may include, for example, a Au layer (a gold layer) and a Ni layer (a nickel layer) provided between the Au layer and the second semiconductor layer 12. The thickness of the Ni layer may be 0.1 μm; and the thickness of the Au layer may be 0.1 μm.

The first electrode 14 may include, for example, a Au layer and a Ni layer provided between the Au layer and the first semiconductor layer 11. The thickness of the Au layer may be, for example, 0.1 μm; and the thickness of the Ni layer may be 0.1 μm. The first electrode 14 may be provided, for example, in the region of substantially the entire first semiconductor layer 11 on the second major surface 10a side. However, the region where the first electrode 14 is provided is arbitrary. The first electrode 14 is provided in at least a portion of the first semiconductor layer 11 on the second major surface 10a side.

The first electrode 14 may include a conductive layer and a reflective layer provided between the conductive layer and the first semiconductor layer 11. Thus, the first electrode 14 may have a stacked structure.

The conductive layer of the second electrode 15 may include, for example, a Au layer and a Ni layer provided between the Au layer and the second semiconductor layer 12. The thickness of the Au layer may be, for example, 0.1 μm; and the thickness of the Ni layer may be 0.1 μm. The second electrode 15 can be provided in, for example, the region of substantially the entire second semiconductor layer 12 on the second major surface 10a side. However, the region where the second electrode 15 is provided is arbitrary. The second electrode 15 is provided in at least a portion of the second semiconductor layer 12 on the second major surface 10a side.

The first connection portion 32a included in the first conductive member 30a may include a metal such as, for example, Cu. The first connection portion 32a may include a first layer and a second layer. The first layer is provided between the second layer and the first electrode 14. In other words, the first layer contacts the first electrode 14. The first layer is, for example, a seed layer; and the second layer is, for example, a plating layer. The surface area of the first layer may be equivalent to the surface area of the first electrode 14 or less than the surface area of the first electrode 14. The surface area of the second layer may be, for example, 250 μm by 150 μm. The thickness of the first layer may be, for example, about 1 μm. The thickness of the second layer may be, for example, 10 μm.

The second connection portion 32b included in the second conductive member 30b may include a metal such as, for example, Cu. The second connection portion 32b may include a third layer and a fourth layer. The third layer is provided between the fourth layer and the second electrode 15. In other words, the third layer contacts the second electrode 15. The third layer is, for example, a seed layer; and the fourth layer is, for example, a plating layer. The third layer is in the same layer as the first layer; and the material of the third layer may be the same as the material of the first layer. The fourth layer is in the same layer as the second layer; and the material of the fourth layer may be the same as the material of the second layer. The surface area of the third layer may be equivalent to the surface area of the second electrode 15 or less than the surface area of the second electrode 15. The surface area of the fourth layer may be, for example, 250 μm by 350 μm. The thickness of the third layer may be, for example, about 1 μm. The thickness of the fourth layer may be, for example, 10 μm.

However, the surface area, the configuration, and the thickness of the first to fourth layers are arbitrary. The first connection portion 32a and the second connection portion 32b may be thin films of single layers or may be stacked films as recited above. The first connection portion 32a may further include other layers stacked on the first layer and the second layer. The second connection portion 32b may further include other layers stacked on the third layer and the fourth layer.

The first columnar portion 31a may include a metal such as, for example, Cu. The cross section of the first columnar portion 31a when cut by the X-Y plane may be, for example, a 200 μm by 150 μm rectangle. The thickness (the length along the Z-axis direction) of the first columnar portion 31a may be about, for example, 60 μm. The first electrode 14 is electrically connected to the first columnar portion 31a by the first connection portion 32a.

The second columnar portion 31b may include a metal such as, for example, Cu. The cross section of the second columnar portion 31b when cut by the X-Y plane may be, for example, a 200 μm by 150 μm rectangle. The thickness (the length along the Z-axis direction) of the second columnar portion 31b may be about, for example, 60 μm. The second electrode 15 is electrically connected to the second columnar portion 31b by the second connection portion 32b.

The material, the configuration of the cross section, the cross-sectional area, and the thickness of the first columnar portion 31a and the second columnar portion 31b are not limited to those recited above and are arbitrary.

The sealing member 50 may include, for example, a thermosetting resin. The thickness of the sealing member 50 is about the same as the thicknesses of the first columnar portion 31a and the second columnar portion 31b, e.g., about 60 μm. The sealing member 50 covers the side surface of the first conductive member 30a (the side surface of the first columnar portion 31a and the side surface of the first connection portion 32a) and the side surface of the second conductive member 30b (the side surface of the second columnar portion 31b and the side surface of the second connection portion 32b) while leaving the first end surface 31ae of the first conductive member 30a and the second end surface 31be of the second conductive member 30b exposed. The sealing member 50 also may cover the surfaces of the first connection portion 32a and the second connection portion 32b on the side opposite to the semiconductor stacked body 10. The sealing member 50 may further cover the entire second major surface 10a side of the semiconductor stacked body 10.

As described below, the sealing member 50 may include a first sealing layer and a second sealing layer. The first sealing layer is provided between the second sealing layer and the semiconductor stacked body 10. Thus, the sealing member 50 may have a two-layer structure. The first sealing layer may include, for example, polyimide. The second sealing layer may include, for example, an epoxy-based thermosetting resin.

An example of a method for manufacturing the semiconductor light emitting device 110 will now be described.

FIG. 2A to FIG. 2E, FIG. 3A to FIG. 3E, and FIG. 4A to FIG. 4E are schematic cross-sectional views in order of the processes, illustrating the method for manufacturing the semiconductor light emitting device according to the first embodiment.

Namely, these drawings are cross-sectional views corresponding to the cross section along line A-A' of FIG. 1B.

This manufacturing method is a method of collectively manufacturing multiple semiconductor light emitting devices 110 at the wafer level.

Figure 2A:
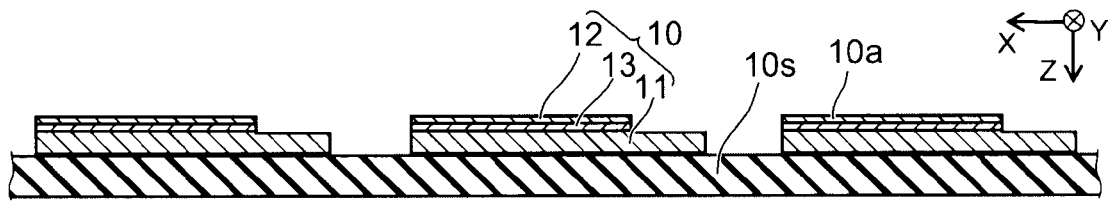
FIG. 2A to FIG. 2E are schematic cross-sectional views in order of the processes, illustrating a method for manufacturing the semiconductor light emitting device according to the first embodiment.

As illustrated in FIG. 2A, a substrate 10s is used on which the semiconductor stacked body 10 is formed. The substrate 10s may include, for example, a sapphire substrate. The size of the substrate 10s is, for example, 4 inches in diameter; and the thickness of the substrate 10s is, for example, about 500 μm. The method of forming the semiconductor stacked body 10 is, for example, as follows. Namely, a crystal film used to form the first semiconductor layer 11, a crystal film used to form the light emitting layer 13, and a crystal film used to form the second semiconductor layer 12, which are nitride semiconductors, are epitaxially grown on the substrate 10s; these crystal films are etched using, for example, RIE (Reactive Ion Etching); and a portion of the first semiconductor layer 11 on the second major surface 10a side is exposed. These crystal films are patterned using, for example, RIE and singulated to form the multiple semiconductor stacked bodies 10.

Figure 2B:
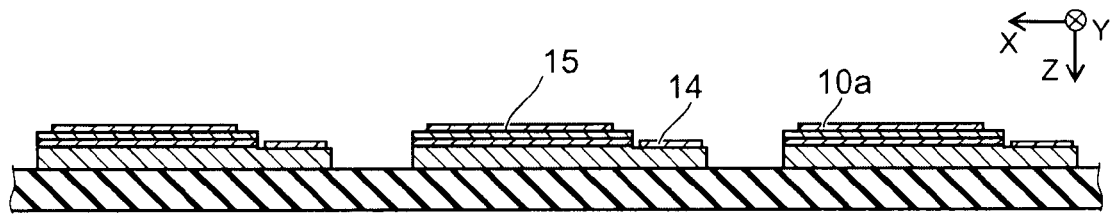

Then, as illustrated in FIG. 2B, the first electrode 14 and the second electrode 15 are formed by forming a film used to form the first electrode 14 and the second electrode 15 on the second major surface 10a of the semiconductor stacked body 10 and by patterning this film into a prescribed configuration. Then, the protective layer 18 is formed. The protective layer 18 is not illustrated in FIG. 2B to avoid complexity.

Specifically, for example, a film used to form a contact electrode layer is formed on the second major surface 10a of the semiconductor stacked body 10. Namely, a Ni film is formed with a thickness of 0.1 μm; and a Au film is formed with a thickness of 0.1 μm thereon. Thereby, the film used to form the contact electrode layer is formed. The formation of the Ni film and the Au film may include, for example, sputtering. Further, a layer used to form a reflective layer is formed on the Au film. Namely, a film including at least one selected from Ag and Al is formed as the reflective layer with a thickness of, for example, 0.3 μm. In such a case as well, sputtering may be used. Thereby, the film used to form the reflective layer is formed.

A conductive film used to form the conductive layers of the first electrode 14 and the second electrode 15 is formed on the film used to form the reflective layer. Namely, a Ni film of, for example, 0.1 μm is formed on the film used to form the reflective layer; and a Au film is formed thereon with a thickness of 0.1 μm. The formation of the Ni film and the Au film may include, for example, sputtering.

The film used to form the contact electrode layer, the film used to form the reflective layer, and the conductive film used to form the conductive layers of the first electrode 14 and the second electrode 15 recited above are patterned into a prescribed configuration. Thereby, the first electrode 14 and the second electrode 15 are formed. The patterning of each of the films recited above may include any method such as, for example, lift-off. The contact electrode layer, the reflective layer, and the conductive layer of the first electrode 14 may have mutually different pattern configurations. The contact electrode layer, the reflective layer, and the conductive layer of the second electrode 15 may have mutually different pattern configurations.

Then, a $SiO_2$ film used to form the protective layer 18 is formed with a thickness of, for example, 0.3 μm using, for example, CVD in a region excluding at least a portion of the first electrode 14 and a region excluding at least a portion of the second electrode 15; and the protective layer 18 is formed by patterning using, for example, dry etching or wet etching.

Figure 2C:
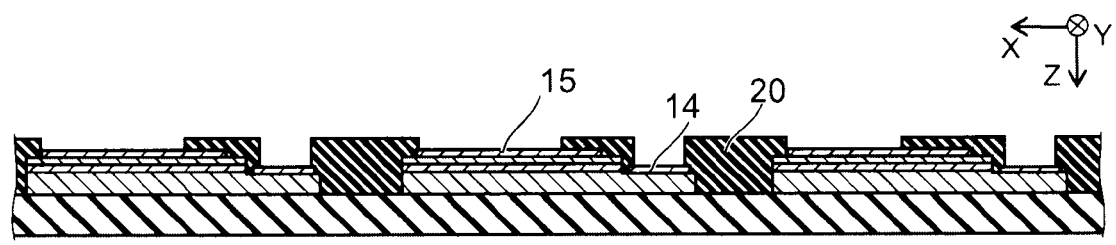

Continuing as illustrated in FIG. 2C, the insulating layer 20 is formed to cover the certain portion 12p of the second semiconductor layer 12 on the second major surface 10a side. The insulating layer 20 is formed in a region excluding at least a portion of the first electrode 14 and a region excluding at least a portion of the second electrode 15. In this specific example, the insulating layer 20 also is provided between the multiple semiconductor stacked bodies 10.

The insulating layer 20 may include, for example, polyimide and/or PBO (polybenzoxazole). In other words, for example, the insulating layer 20 is formed selectively by forming a polyimide film used to form the insulating layer 20 on the entire surface of the second major surface 10a of the semiconductor stacked body 10, by exposing using, for example, a mask, and by developing. The patterned insulating layer 20 is baked if necessary.

Subsequently, a conductive film used to form at least a portion of the first conductive member 30a is formed on the insulating layer 20 covering the certain portion 12p of the second semiconductor layer 12 on the second major surface 10a side. This conductive film also may be used to form at least a portion of the second conductive member 30b. This conductive film also may be formed to cover at least a portion of the first electrode 14 not covered with the insulating layer 20 and at least a portion of the second electrode 15 not covered with the insulating layer 20. Specifically, the following processing is performed.

Figure 2D:
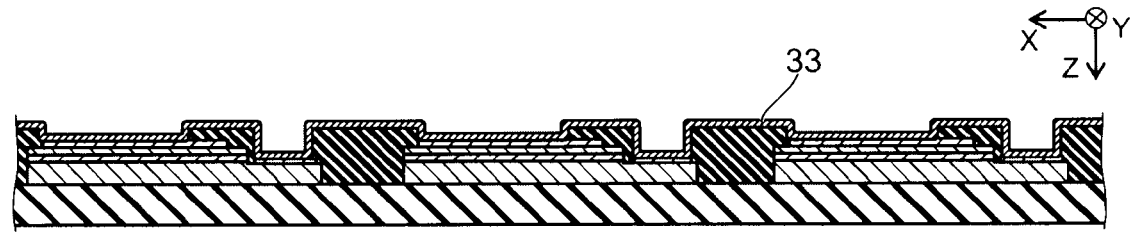

Namely, as illustrated in FIG. 2D, a seed layer 33 used to form the first layer of the first connection portion 32a and the third layer of the second connection portion 32b is formed, for example, on the entire surface of the substrate 10s on the second major surface 10a side. The seed layer 33 is formed using, for example, a physical covering method such as vapor deposition, sputtering, etc. The seed layer 33 functions as the power supply layer of the plating process described below. The seed layer 33 may include, for example, a stacked film of a Ti film and a Cu film. The adhesion strength between the Cu film and the resists and between the Cu film and the pads (the first electrode 14 and the second electrode 15) can be increased by the Ti layer of the seed layer 33. The thickness of the Ti layer may be, for example, about 0.2 μm. On the other hand, the Cu film of the seed layer 33 contributes mainly to the power supply. It is desirable for the thickness of the Cu film to be not less than 0.2 μm.

Figure 2E:
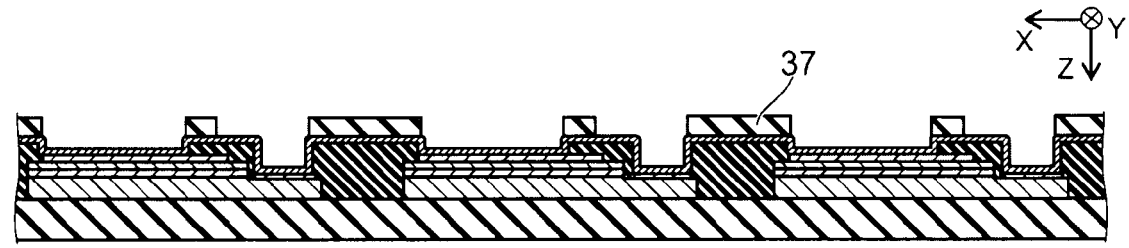

Then, as illustrated in FIG. 2E, a first resist layer 37 is formed in a region other than the region corresponding to the first connection portion 32a and the region corresponding to the second connection portion 32b. The first resist layer 37 may include, for example, a photosensitive liquid resist or dry film resist. The first resist layer 37 is formed by first forming a film used to form the first resist layer 37 and subsequently exposing using a light-shielding mask having prescribed openings and developing. The first resist layer 37 may be baked if necessary.

Figure 3A:
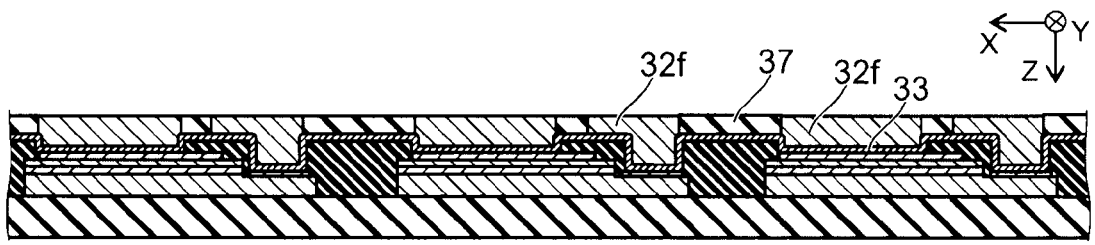
FIG. 3A to FIG. 3E are schematic cross-sectional views in order of the processes, illustrating a method for manufacturing the semiconductor light emitting device according to the first embodiment.

Then, as illustrated in FIG. 3A, a connection portion conductive film 32f used to form the second layer of the first connection portion 32a and the fourth layer of the second connection portion 32b is formed in a region where the first resist layer 37 is not provided. The connection portion conductive film 32f is formed using, for example, electroplating. In the electroplating, for example, the substrate 10s on which the processed body recited above is provided is immersed in a plating liquid made of copper sulfate and sulfuric acid; the seed layer 33 is connected to the negative terminal of a direct-current power source; and a Cu plate used as an anode is disposed opposing the surface to be plated of the substrate 10s and connected to the positive terminal of the direct-current power source. The plating of the Cu is performed by providing a current between the negative terminal and the positive terminal. The thickness of the plating film of the plating process increases as time elapses; and the plating is completed by stopping the flow of the current when the thickness of the plating film reaches the necessary thickness. Thereby, the connection portion conductive film 32f made of the plating film is formed in the openings of the first resist layer 37.

The seed layer 33 (the first layer) at the position corresponding to the first electrode 14 and the connection portion conductive film 32f (the second layer) at the position corresponding to the first electrode 14 are used to form the first connection portion 32a. The seed layer 33 (the third layer) at the position corresponding to the second electrode 15 and the connection portion conductive film 32f (the fourth layer) at the position corresponding to the second electrode 15 are used to form the second connection portion 32b.

The first connection portion 32a corresponds to the conductive film used to form at least a portion of the first conductive member 30a formed on the insulating layer 20 covering the certain portion 12p of the second semiconductor layer 12 on the second major surface 10a side. In this specific example, the seed layer 33 and the connection portion conductive film 32f used to form the conductive film also are the conductive film used to form at least a portion of the second conductive member 30b. Further, the seed layer 33 and the connection portion conductive film 32f used to form the conductive film are formed to cover at least a portion of the first electrode 14 not covered with the insulating layer 20 and at least a portion of the second electrode 15 not covered with the insulating layer 20.

Subsequently, the first columnar portion 31a is formed on the first connection portion 32a (the conductive film used to form at least a portion of the first conductive member 30a formed on the insulating layer 20 covering the certain portion 12p of the second semiconductor layer 12 on the second major surface 10a side). Specifically, for example, the following processing is performed.

Figure 3B:
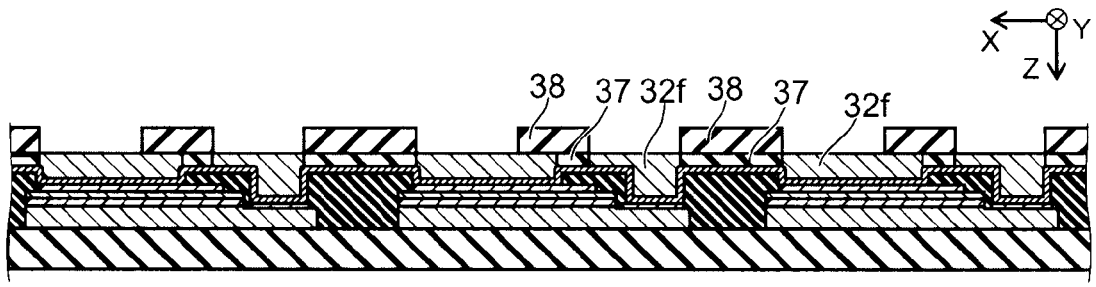

As illustrated in FIG. 3B, a second resist layer 38 is formed in a region other than the region corresponding to the first columnar portion 31a and the region corresponding to the second columnar portion 31b. The materials and the methods described in regard to the first resist layer 37 may be employed for the material of the second resist layer 38 and the formation of the second resist layer 38.

Figure 3C:
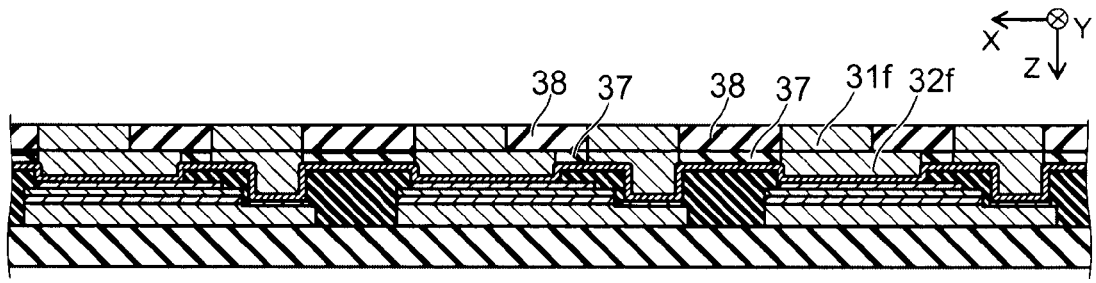

Then, as illustrated in FIG. 3C, a columnar portion conductive film 31f used to form the first columnar portion 31a and the second columnar portion 31b is formed in a region where the second resist layer 38 is not provided. The columnar portion conductive film 31f also is formed using, for example, electroplating. The materials and the methods described in regard to the formation of the connection portion conductive film 32f may be applied to the formation of the columnar portion conductive film 31f. The portion of the columnar portion conductive film 31f connected to the first connection portion 32a is used to form the first columnar portion 31a; and the portion of the columnar portion conductive film 31f connected to the second connection portion 32b is used to form the second columnar portion 31b.

Figure 3D:
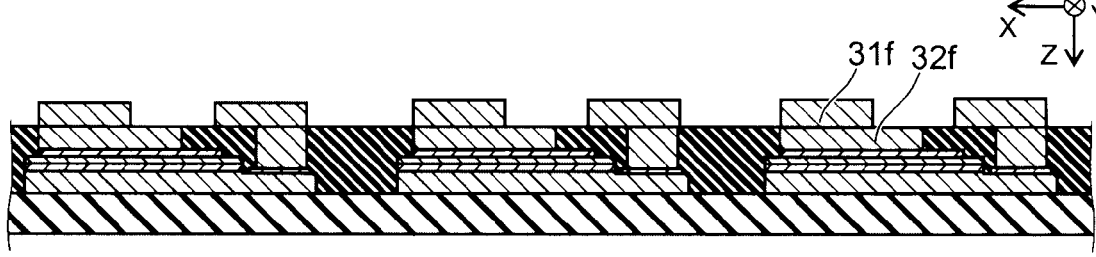

Continuing as illustrated in FIG. 3D, the first resist layer 37 and the second resist layer 38 are removed. The exposed seed layer 33 is removed using, for example, acid cleaning. The seed layer 33 covered with the connection portion conductive film 32f remains as the first layer and the third layer which are included in the first connection portion 32a and the second connection portion 32b, respectively.

Figure 3E:
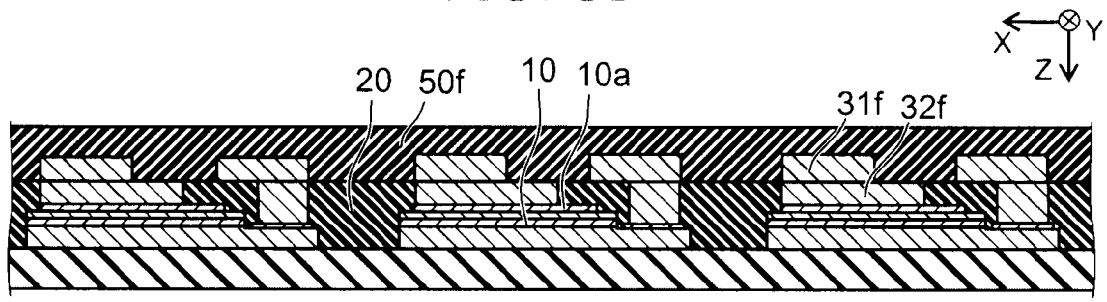

Then, as illustrated in FIG. 3E, a resin layer 50f used to form the sealing member 50 is formed on the surface of the substrate 10s on the second major surface 10a side. The resin layer 50f may include, for example, a thermosetting resin. The resin layer 50f is formed by, for example, forming a film used to form the resin layer 50f on the surface of the substrate 10s on the second major surface 10a side with a thickness enough to bury the first columnar portion 31a and the second columnar portion 31b by a method such as printing and by heating to cure. The heating conditions when curing the resin layer 50*f* are, for example, about 150° C. for about 2 hours.

Figure 4A:
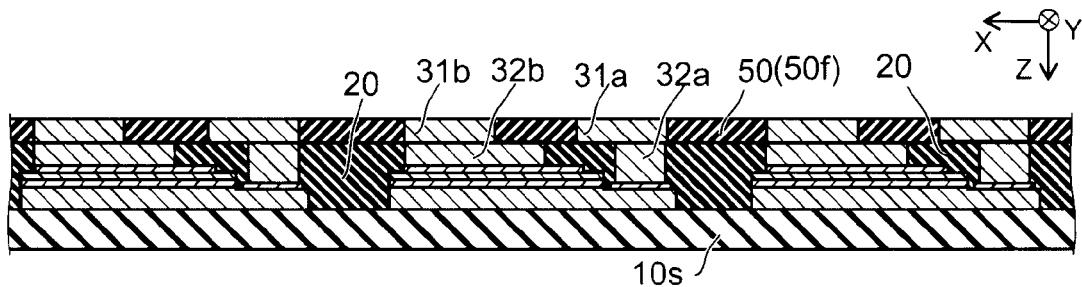
FIG. 4A to FIG. 4E are schematic cross-sectional views in order of the processes, illustrating a method for manufacturing the semiconductor light emitting device according to the first embodiment.

Continuing as illustrated in FIG. 4A, the first columnar portion 31*a* and the second columnar portion 31*b* are exposed by polishing the front surface of the resin layer 50*f*. Thereby, the sealing member 50 is formed. A portion of the first columnar portion 31*a* and a portion of the second columnar portion 31*b* may be polished when polishing the resin layer 50*f*. Thereby, the first end surface 31*ae* of the first columnar portion 31*a* and the second end surface 31*be* of the second columnar portion 31*b* are disposed in the surface including the surface of the sealing member 50 on the side opposite to the second major surface 10*a*.

A rotating polishing wheel, for example, may be used in the polishing recited above. By the rotational polishing, the polishing can be implemented while ensuring the planarity. After the polishing, drying is performed if necessary.

Figure 4B:
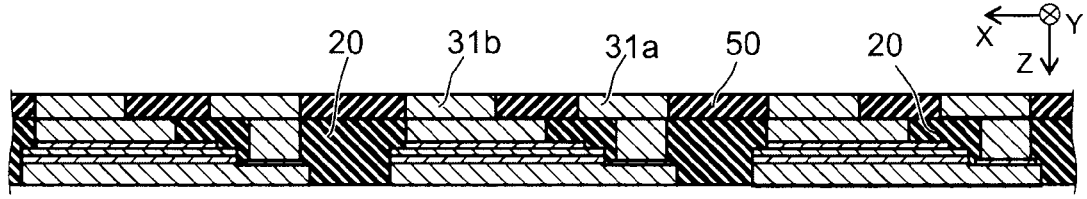

Then, as illustrated in FIG. 4B, the substrate 10*s* is removed from the semiconductor stacked body 10. In other words, the substrate 10*s* is separated from the semiconductor stacked body 10 by, for example, irradiating laser light from the surface of the substrate 10*s* on the side opposite to the semiconductor stacked body 10 through the substrate 10*s* onto a layer (e.g., a GaN layer) included in the semiconductor stacked body 10 to decompose at least a portion of this layer. The laser light may include, for example, laser light having a wavelength shorter than a bandgap wavelength based on the bandgap of GaN. For example, a Nd:YAG third harmonic laser may be used. However, the laser light used is arbitrary.

Figure 4C:
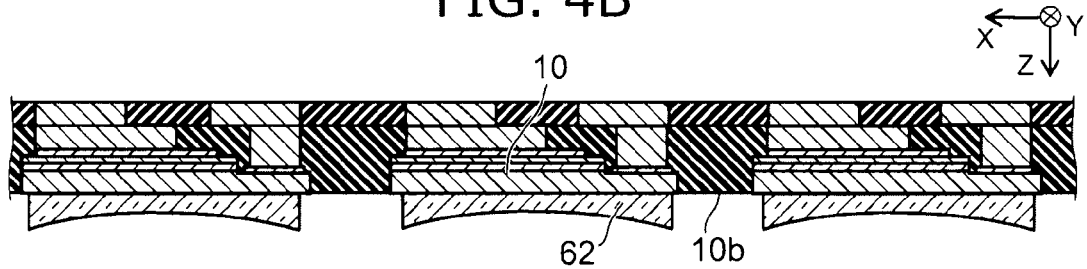

Continuing as illustrated in FIG. 4C, in this specific example, the transparent member 62 used to form a portion of the optical layer 60 is formed on the first major surface 10*b* of the semiconductor stacked body 10. In other words, the transparent member 62 is formed, for example, by coating a liquid transparent resin layer onto the first major surface 10*b* of the semiconductor stacked body 10 using printing, etc., deforming the transparent resin layer into a prescribed configuration by pressing a template including the prescribed configuration onto the transparent resin layer, subsequently releasing the template, and curing if necessary by performing at least one processing selected from heating and ultraviolet irradiation. By employing such methods, the transparent member 62 can be formed easily in any configuration by using a template having the desired configuration.

Figure 4D:
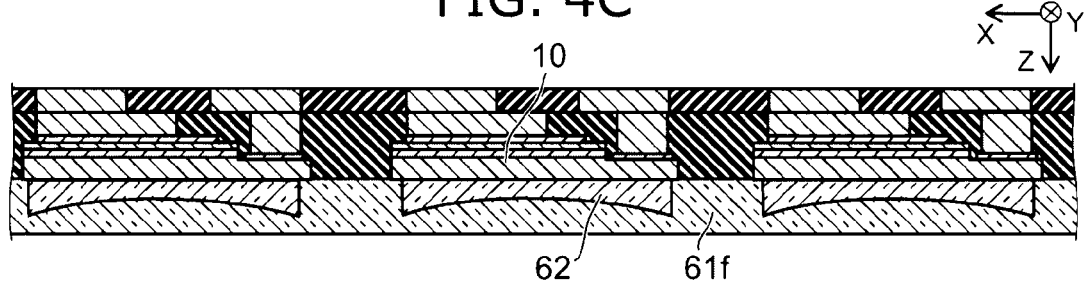

Then, as illustrated in FIG. 4D, a fluorescer film 61*f* used to form the fluorescer layer 61 is formed to cover the transparent member 62. The fluorescer film 61*f* is formed by, for example, coating a resin material, into which a fluorescer particle and a silicone resin are mixed, using spin coating or printing to cover the transparent member 62 and by subsequently thermally curing the resin material. The resin material may include, for example, a material that cures by heating at 150° C. for 1 hour.

Figure 4E:
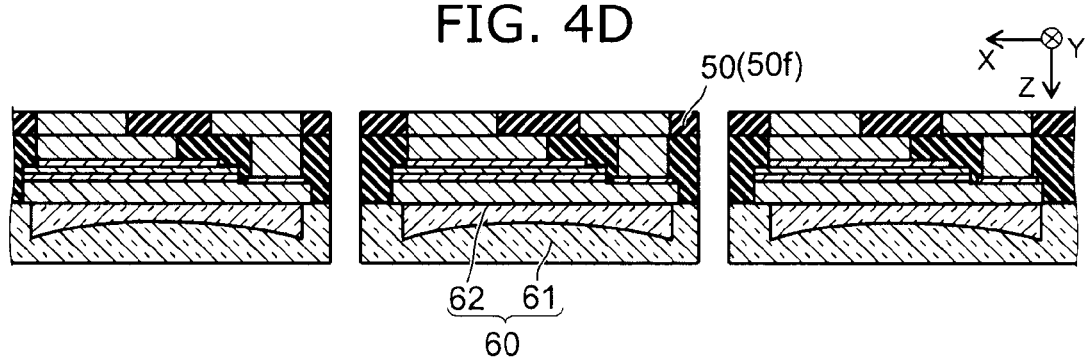

Continuing as illustrated in FIG. 4E, the resin layer 50*f* used to form the sealing member 50 and the fluorescer film 61*f* used to form the fluorescer layer 61 are separated into the multiple semiconductor stacked bodies 10 by cutting. Thereby, the multiple semiconductor light emitting devices 110 can be collectively manufactured. The cutting recited above may include, for example, dicing using a dicer.

In the method for manufacturing recited above, the electrode, the sealing member, and the optical layer can be formed collectively at the wafer level; and the productivity is high. Inspections also are possible at the wafer level. Thereby, a semiconductor light emitting device can be manufactured with high productivity. Downsizing is easy because members such as leadframes, conductive substrates, bonding wires, etc., are unnecessary. Reduced costs also are possible.

In the process of separating the substrate 10*s* from the semiconductor stacked body 10 described in regard to FIG. 4B, there are cases where the film used to form the insulating layer 20 reaches a high temperature. In other words, the film used to form the insulating layer 20 may be heated when irradiating the laser light from the surface of the substrate 10*s* on the side opposite to the semiconductor stacked body 10 through the substrate 10*s* onto the semiconductor stacked body 10. It is desirable for the film used to form the insulating layer 20 to include a material having high heat resistance to suppress the degradation of the film used to form the insulating layer 20 due to the heating at this time.

For example, it is more desirable for the insulating layer 20 to include a resin having a heat resistance higher than that of the resin of the sealing member 50. In other words, it is more desirable for the thermal decomposition temperature of the insulating layer 20 to be higher than the thermal decomposition temperature of the sealing member 50. For example, the insulating layer 20 may include a polyimide having a thermal decomposition temperature not less than about 380° C.; and the sealing member 50 may include an epoxy resin having, for example, a thermal decomposition temperature not less than about 280° C. and not more than about 300° C. The temperature at which, for example, the weight is reduced by a constant proportion (e.g., 5 percent) by heating can be employed as the thermal decomposition temperature.

The occurrence of defects caused by the filler due to the high temperature of the film used to form the insulating layer 20 may occur in the case where the film used to form the insulating layer 20 includes a filler. To suppress the occurrence of such defects, it is desirable for the content ratio of the filler included in the insulating layer 20 to be set to be lower than the content ratio of the filler included in the sealing member 50. For example, the insulating layer 20 may include a polyimide substantially not including a filler.

FIG. 5A to FIG. 5C and FIG. 6A to FIG. 6C are schematic cross-sectional views illustrating the configuration of other semiconductor light emitting devices according to the first embodiment.

Namely, these drawings are cross-sectional views corresponding to the cross section along line A-A' of FIG. 1B.

Figure 5A:
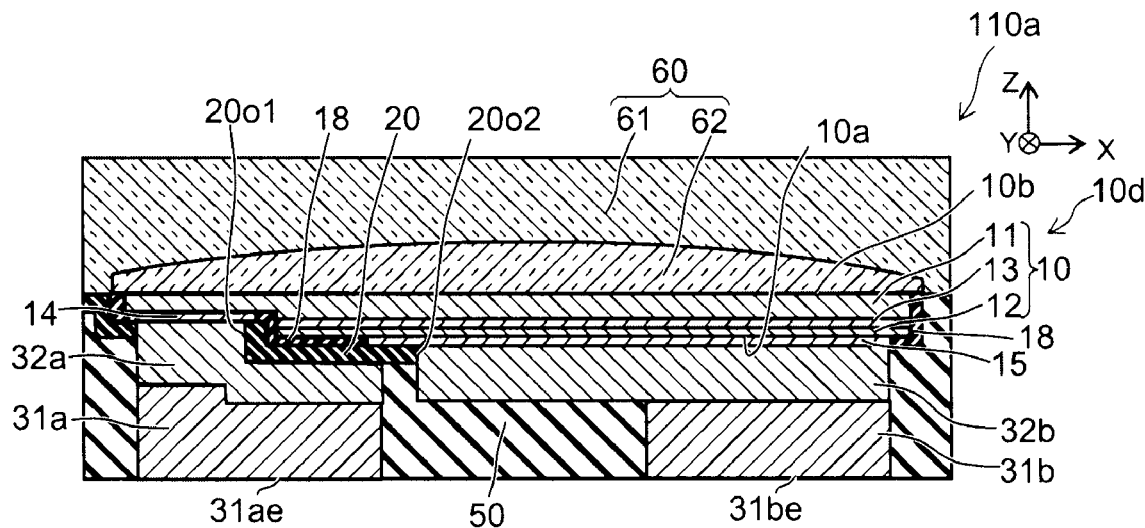
FIG. 5A to FIG. 5C are schematic cross-sectional views illustrating the configuration of other semiconductor light emitting devices according to the first embodiment.

In a semiconductor light emitting device 110*a* according to this embodiment as illustrated in FIG. 5A, the transparent member 62 has a convex lens configuration.

The thickness of the transparent member 62 may be constant. In other words, other than having a lens effect, the transparent member 62 also may have an effect of suppressing the temperature increase of the semiconductor stacked body 10. In other words, although a portion of the energy is absorbed to generate heat during the wavelength conversion of the fluorescer layer 61, the fluorescer layer 61 can be distal to the semiconductor stacked body 10 and the increase of the temperature of the semiconductor stacked body 10 can be suppressed by providing the transparent member 62 between the fluorescer layer 61 and the semiconductor stacked body 10.

Thus, the configuration of the transparent member 62 is arbitrary.

Figure 5B:
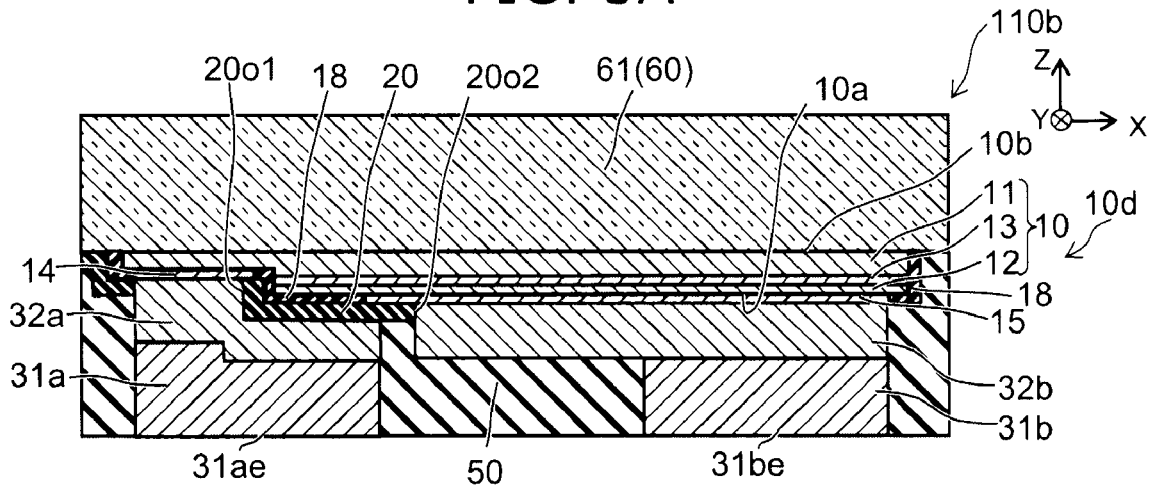

In a semiconductor light emitting device 110*b* as illustrated in FIG. 5B, the fluorescer layer 61 is provided in the optical layer 60, but the transparent member 62 is not provided. Thus, the transparent member 62 may be provided if necessary.

Figure 5C:
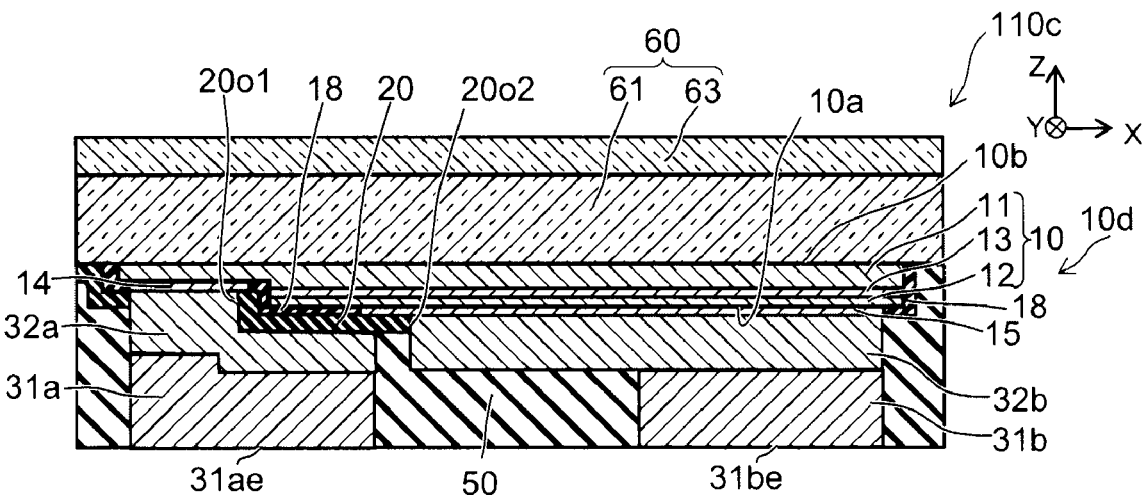

In a semiconductor light emitting device 110*c* according to this embodiment as illustrated in FIG. 5C, the optical layer 60 includes the fluorescer layer 61 including the fluorescer and a hard film 63 provided on a side of the fluorescer layer 61 opposite to the semiconductor stacked body 10. The hard film 63 has a hardness higher than the hardness of the fluorescer layer 61. The hard film 63 is transparent. The hard film 63 may include, for example, a silicone resin having a high hardness. Spin coating or printing, for example, may be employed to form the hard film 63. The hard film 63 may include, for example, silicon nitride, silicon oxide, etc. In such a case, the hard film 63 may be formed by a method such as, for example, sputtering. However, the material and the formation method of the hard film 63 are arbitrary.

By providing the hard film 63, for example, the handling of the semiconductor light emitting device 110c is easier because the light emitting surface (the surface on the optical layer 60 side) of the semiconductor light emitting device 110c can have a high hardness.

For example, in the case where the hardness of the silicone resin of the fluorescer layer 61 is low, there are cases where, for example, it is difficult to perform the appropriate mounting by closely adhering the fluorescer layer 61 to a collet when picking up the semiconductor light emitting device with the collet if the fluorescer layer 61 is exposed at the outermost surface (the surface most distal to the semiconductor stacked body 10) of the optical layer 60. In such a case, good mounting is easier to implement by providing the hard film 63, which has a higher hardness than the fluorescer layer 61, on the fluorescer layer 61.

Figure 6A:
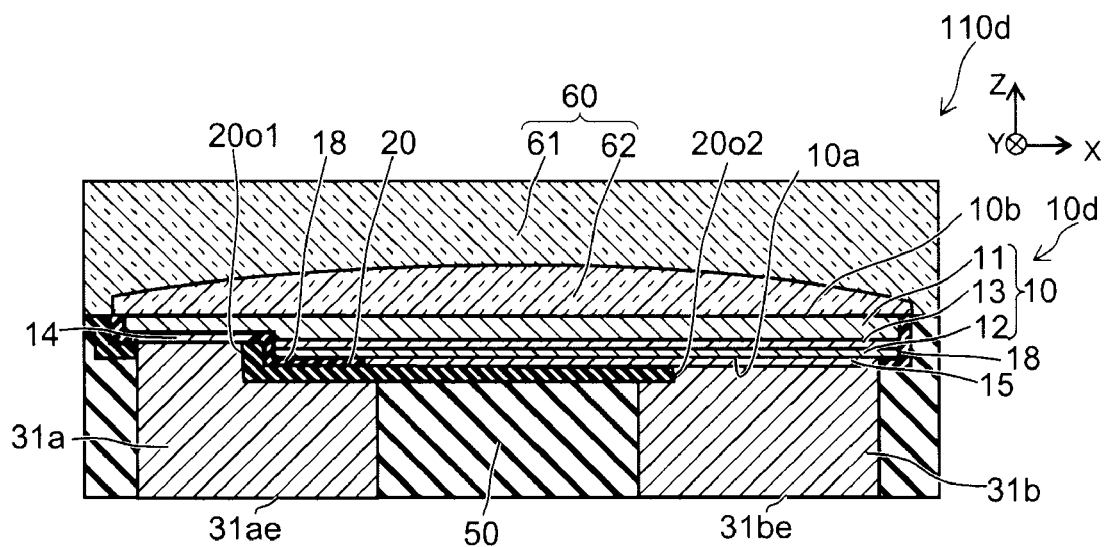
FIG. 6A to FIG. 6C are schematic cross-sectional views illustrating the configuration of other semiconductor light emitting devices according to the first embodiment.
Figure 6B:
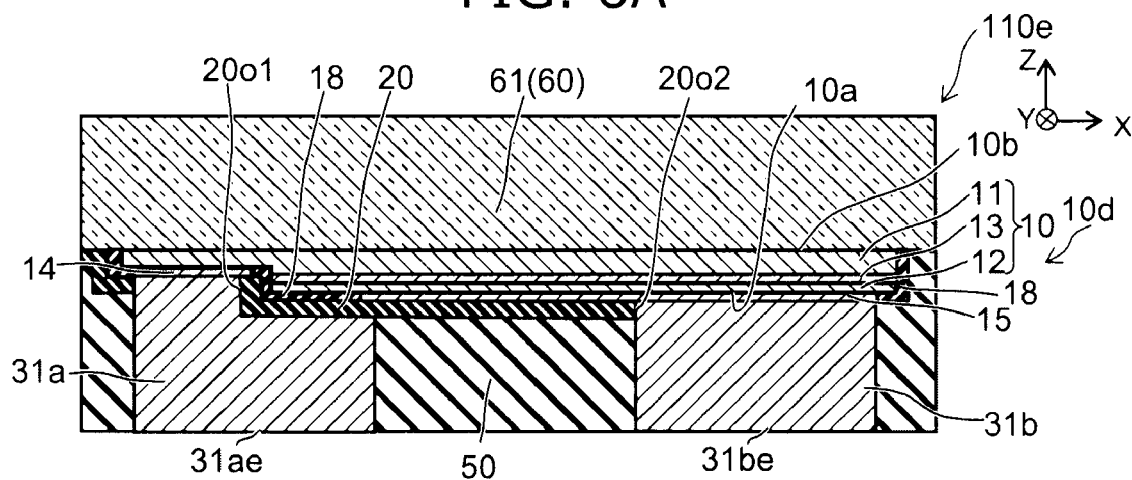
Figure 6C:
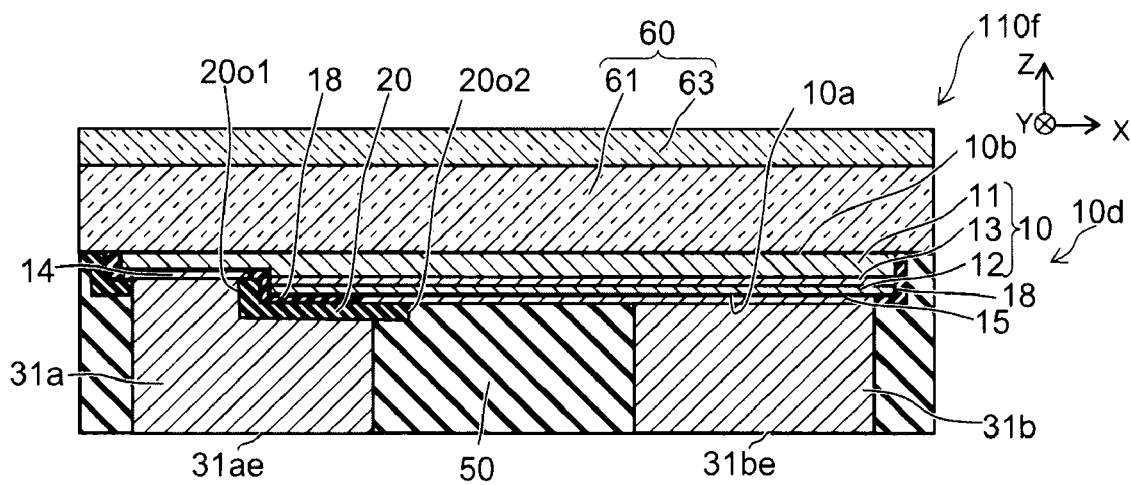

In other semiconductor light emitting devices 110d,110e, and 110f according to this embodiment as illustrated in FIG. 6A, FIG. 6B, and FIG. 6C, the first connection portion 32a and the second connection portion 32b are not provided. In such a case as well, the insulating layer 20 is provided between the first columnar portion 31a and the second semiconductor layer 12; and a portion of the first columnar portion 31a opposes the certain portion 12p of the second semiconductor layer 12 with the insulating layer 20 interposed. Thereby, the surface area of the first end surface 31ae of the first conductive member 30a can be greater than the surface area of the first electrode 14. According to semiconductor light emitting devices 110d,110e, and 110f as well, high electrode connectability can be maintained; and a semiconductor light emitting device suited to downsizing can be provided.

Although the transparent member 62 has a convex lens configuration in the semiconductor light emitting device 110d illustrated in FIG. 6A, the configuration of the transparent member 62 may be a concave lens configuration as in the semiconductor light emitting device 110. Or, the thickness of the transparent member 62 may be constant.

The semiconductor light emitting device 110e illustrated in FIG. 6B is an example in which the transparent member 62 is omitted; and the semiconductor light emitting device 110f illustrated in FIG. 6C is an example in which the hard film 63 described in regard to FIG. 5C is provided.

Second Embodiment

Figure 7A:
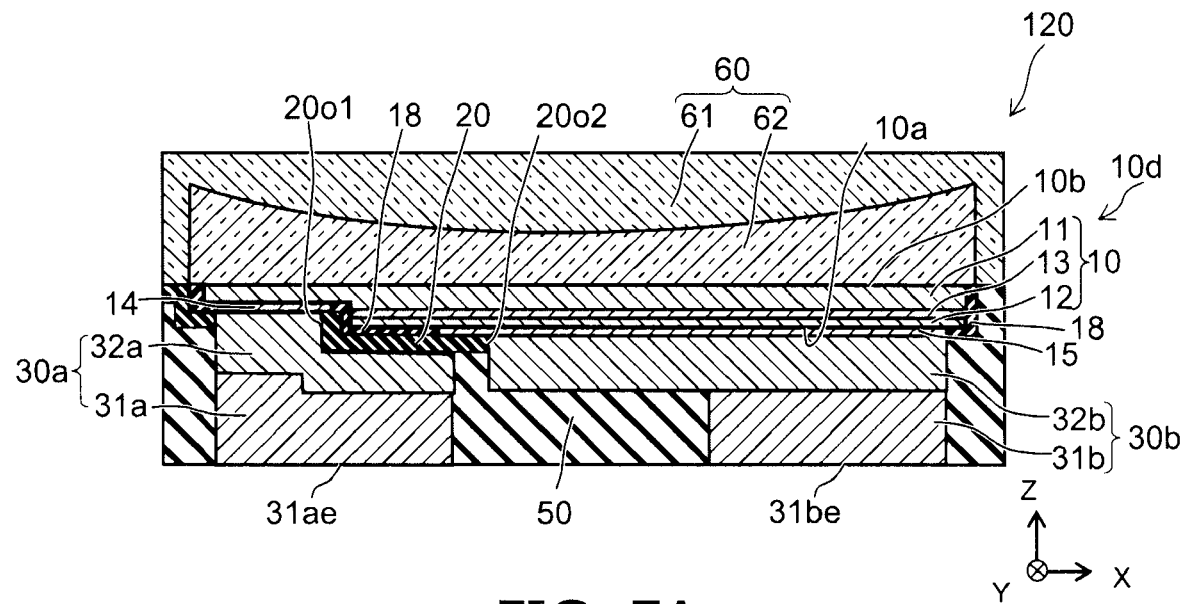
FIG. 7A and FIG. 7B are schematic views illustrating the configuration of a semiconductor light emitting device according to a second embodiment.
Figure 7B:
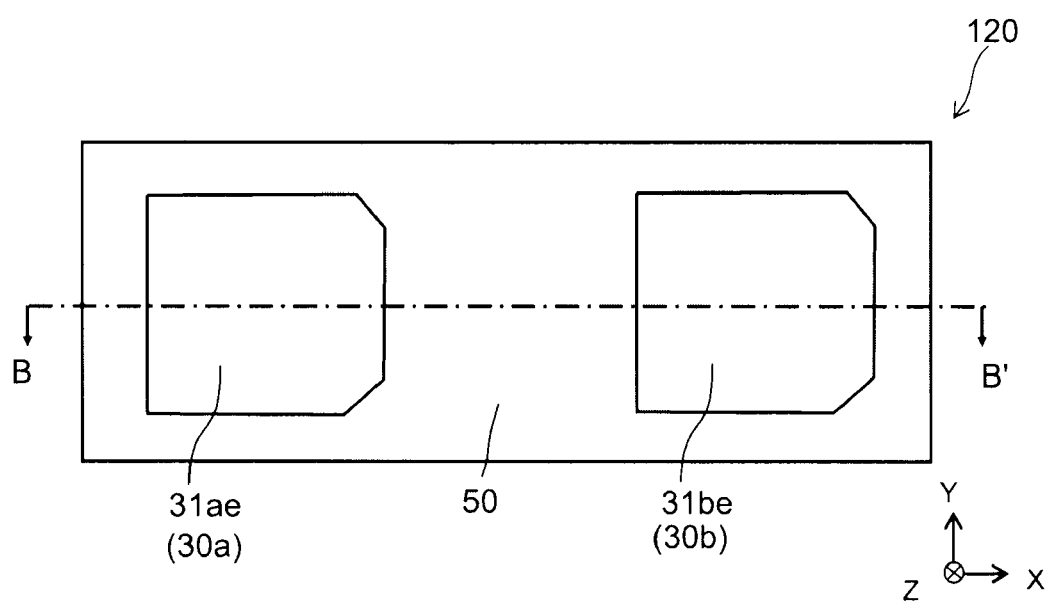

FIG. 7A and FIG. 7B are schematic views illustrating the configuration of a semiconductor light emitting device according to a second embodiment.

Namely, FIG. 7B is a schematic plan view; and FIG. 7A is a cross-sectional view along line B-B' of FIG. 7B.

In the semiconductor light emitting device 120 according to this embodiment as illustrated in FIG. 7A and FIG. 7B, the first end surface 31ae of the first conductive member 30a on the side opposite to the semiconductor stacked body 10 and the second end surface 31be of the second conductive member 30b on the side opposite to the semiconductor stacked body 10 are asymmetrical. Otherwise, the semiconductor light emitting device 120 may be similar to the semiconductor light emitting device 110, and a description is omitted.

In this specific example, oblique sides tilted with respect to the X-axis direction are provided at two corners of the first end surface 31ae of the first conductive member 30a on the second conductive member 30b side. On the other hand, oblique sides tilted with respect to the X-axis direction are provided at two corners of the second end surface 31be of the second conductive member 30b on the side opposite to the first conductive member 30a. In other words, although the configuration of the first end surface 31ae and the configuration of the second end surface 31be are arranged abreast of each other, they have an asymmetrical relationship. In other words, the first end surface 31ae and the second end surface 31be do not have line symmetry with respect to an axis parallel to the Y-axis direction.

By such a configuration, the first conductive member 30a and the second conductive member 30b can be discriminated from each other even in the case where the semiconductor light emitting device 120 is rotated around the Z-axis direction.

According to the semiconductor light emitting device 120, high electrode connectability can be maintained; and a semiconductor light emitting device suited to downsizing can be provided in which the discrimination of the electrodes, which easily becomes problematic particularly when downsizing, is easy.

FIG. 8A to FIG. 8C and FIG. 9A to FIG. 9C are schematic plan views illustrating the configuration of other semiconductor light emitting devices according to the second embodiment.

These drawings illustrate the configurations of the first end surface 31ae and the second end surface 31be when the semiconductor light emitting device is viewed along the Z-axis direction.

Figure 8A:
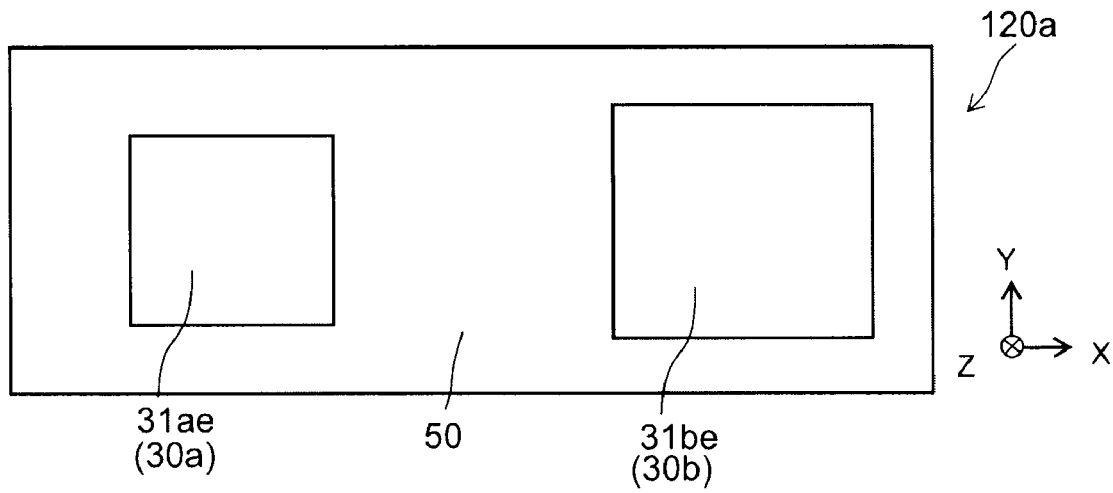
FIG. 8A to FIG. 8C are schematic plan views illustrating the configuration of other semiconductor light emitting devices according to the second embodiment.

In a semiconductor light emitting device 120a according to this embodiment as illustrated in FIG. 8A, the size of the first end surface 31ae is smaller than the size of the second end surface 31be. Thereby, the first end surface 31ae and the second end surface 31be can be discriminated from each other.

Thus, it is desirable for the end surface of the electrode connected to the p-type semiconductor layer to be larger than the end surface of the electrode connected to the n-type semiconductor layer in the case where the size of the first end surface 31ae is different from the size of the second end surface 31be. Because the p-type semiconductor layer reaches high temperatures more easily than the n-type semiconductor layer, the heat of the p-type semiconductor layer which easily reaches high temperatures can be dissipated more easily by employing such a configuration.

Figure 8B:
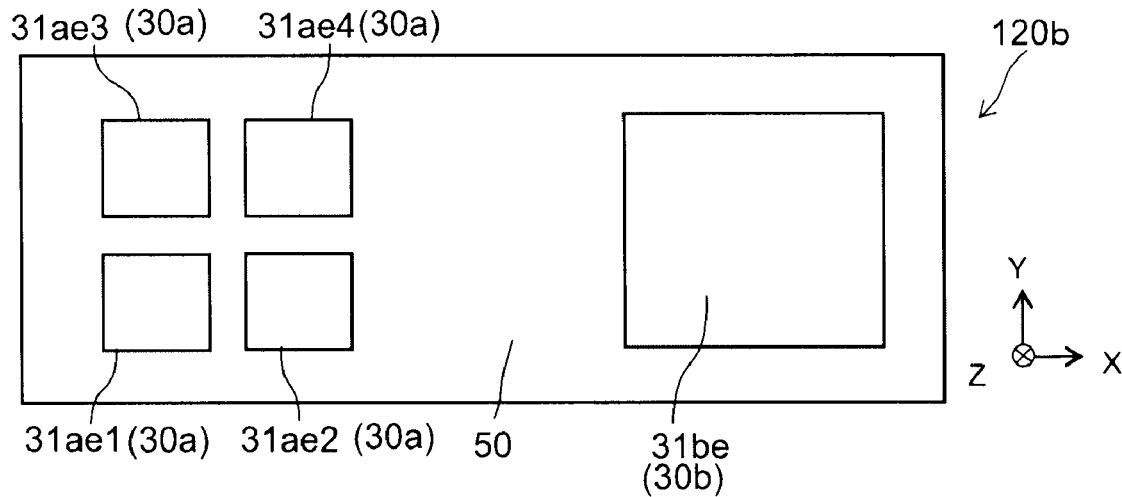

In a semiconductor light emitting device 120b as illustrated in FIG. 8B, the first end surface 31ae includes four end surfaces. In other words, the first end surface 31ae includes first to fourth sub end surfaces 31ae1 to 31ae4. On the other hand, there is one second end surface 31be. Thus, the number of the surfaces included in the first end surface 31ae may be different from the number of the surfaces included in the second end surface 31be. Thereby, the first end surface 31ae and the second end surface 31be can be discriminated from each other. Although the configuration of the entire first end surface 31ae including the first to fourth sub end surfaces 31ae1 to 31ae4 and the configuration of the second end surface 31be have line symmetry or point symmetry in this specific example, the first end surface 31ae and the second end surface 31be are asymmetrical by the number of the surfaces included in the first end surface 31*ae* being different from the number of the surfaces included in the second end surface 31*be*.

Figure 8C:
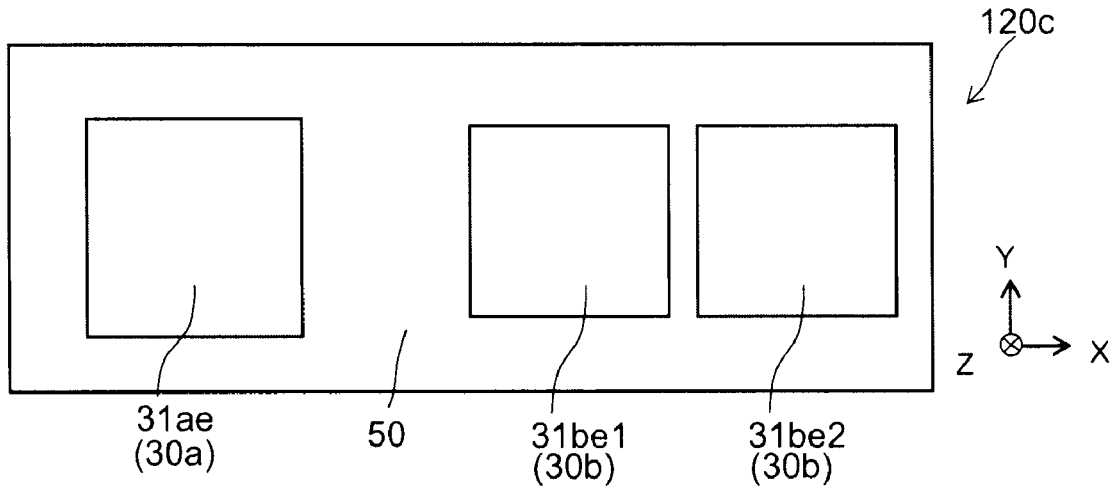

In a semiconductor light emitting device 120*c* as illustrated in FIG. 8C, there is one first end surface 31*ae*. On the other hand, the second end surface 31*be* includes the two surfaces of fifth and sixth sub end surfaces 31*be*1 and 31*be*2. Thus, in such a case as well, the number of the surfaces included in the first end surface 31*ae* is different from the number of the surfaces included in the second end surface 31*be*. Thereby, the first end surface 31*ae* and the second end surface 31*be* can be discriminated from each other. In this specific example, the configuration of the first end surface 31*ae* and the configuration of the entire second end surface 31*be* including the fifth and sixth sub end surfaces 31*be*1 and 31*be*2 are asymmetrical. In this specific example, the surface area of the entire second end surface 31*be* which is connected to the second semiconductor layer 12 and includes the fifth and sixth sub end surfaces 31*be*1 and 31*be*2 is set to be greater than the surface area of the first end surface 31*ae* connected to the first semiconductor layer 11.

Figure 9A:
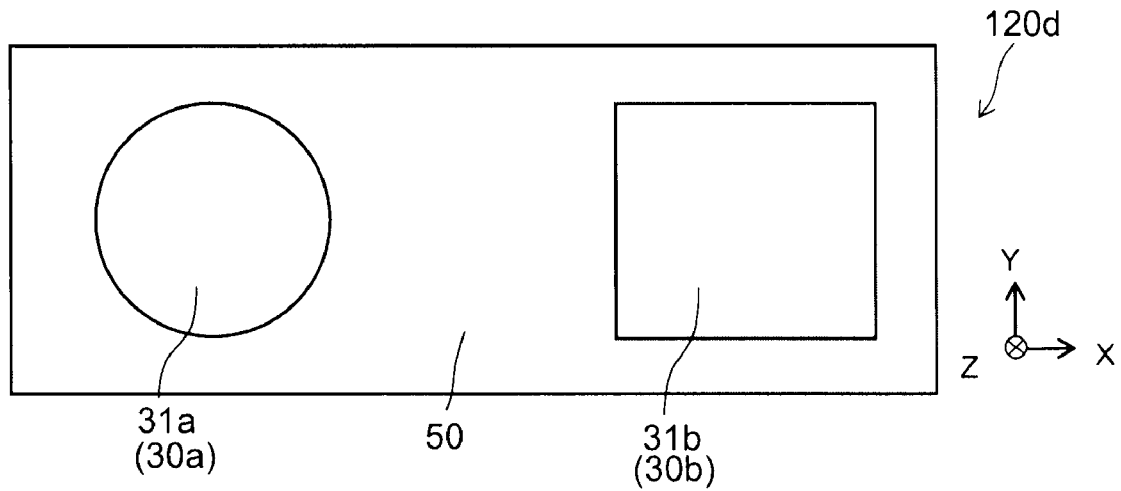
FIG. 9A to FIG. 9C are schematic plan views illustrating the configuration of other semiconductor light emitting devices according to the second embodiment.

In a semiconductor light emitting device 120*d* as illustrated in FIG. 9A, the first end surface 31*ae* is circular; and the second end surface 31*be* is rectangular. Thus, the pattern configuration of the first end surface 31*ae* is different from the pattern configuration of the second end surface 31*be*. Thereby, the first end surface 31*ae* and the second end surface 31*be* can be discriminated from each other.

Figure 9B:
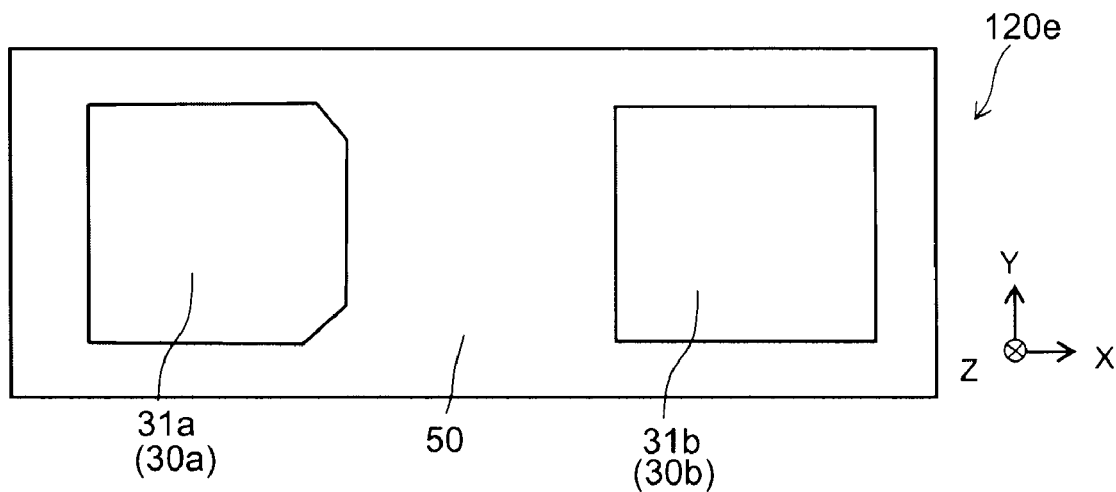

In a semiconductor light emitting device 120*e* as illustrated in FIG. 9B, the first end surface 31*ae* is hexagonal; and the second end surface 31*be* is quadrilateral. Thus, the pattern configuration of the first end surface 31*ae* is different from the pattern configuration of the second end surface 31*be*. Thereby, the first end surface 31*ae* and the second end surface 31*be* can be discriminated from each other. In this specific example, the first end surface 31*ae* has an anisotropic polygonal pattern configuration. Because the pattern configuration is anisotropic, it is also possible to use the pattern configuration to intuitively ascertain the direction in which the current flows. Thereby, the first end surface 31*ae* and the second end surface 31*be* can be discriminated from each other more easily.

Figure 9C:
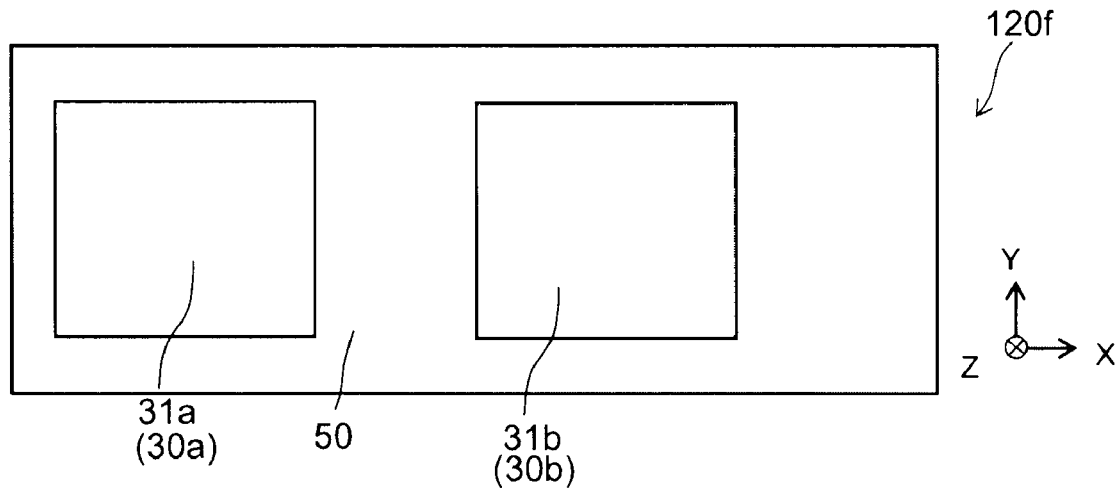

In a semiconductor light emitting device 120*f* as illustrated in FIG. 9C, the disposition of the first end surface 31*ae* with respect to the exterior form of the semiconductor light emitting device and the disposition of the second end surface 31*be* with respect to the exterior form of the semiconductor light emitting device are asymmetrical. In other words, in this specific example, the distance from a side of the first end surface 31*ae* to one side of the exterior form is set to be shorter than the distance from a side of the second end surface 31*be* to one side of the exterior form. Thus, the first end surface 31*ae* and the second end surface 31*be* can be discriminated from each other by the disposition of the first end surface 31*ae* (e.g., the disposition with respect to the exterior form of the semiconductor light emitting device) and the disposition of the second end surface 31*be* (e.g., the disposition with respect to the exterior form of the semiconductor light emitting device) being asymmetrical.

Thus, the first end surface 31*ae* and the second end surface 31*be* being asymmetrical includes the case where, for example, the size of the first end surface 31*ae* is different from the size of the second end surface 31*be*. It also includes the case where, for example, the number of the first end surfaces 31*ae* is different from the number of the second end surfaces 31*be*. It also includes the case where, for example, the pattern configuration of the first end surface 31*ae* is different from the pattern configuration of the second end surface 31*be*. It also includes the case where, for example, the disposition of the first end surface 31*ae* and the disposition of the second end surface 31*be* are asymmetrical.

The configuration recited above in which the first end surface 31*ae* and the second end surface 31*be* are asymmetrical can be applied to the semiconductor light emitting device according to any of the embodiments described above; and similar effects can be realized.

Third Embodiment

Figure 10:
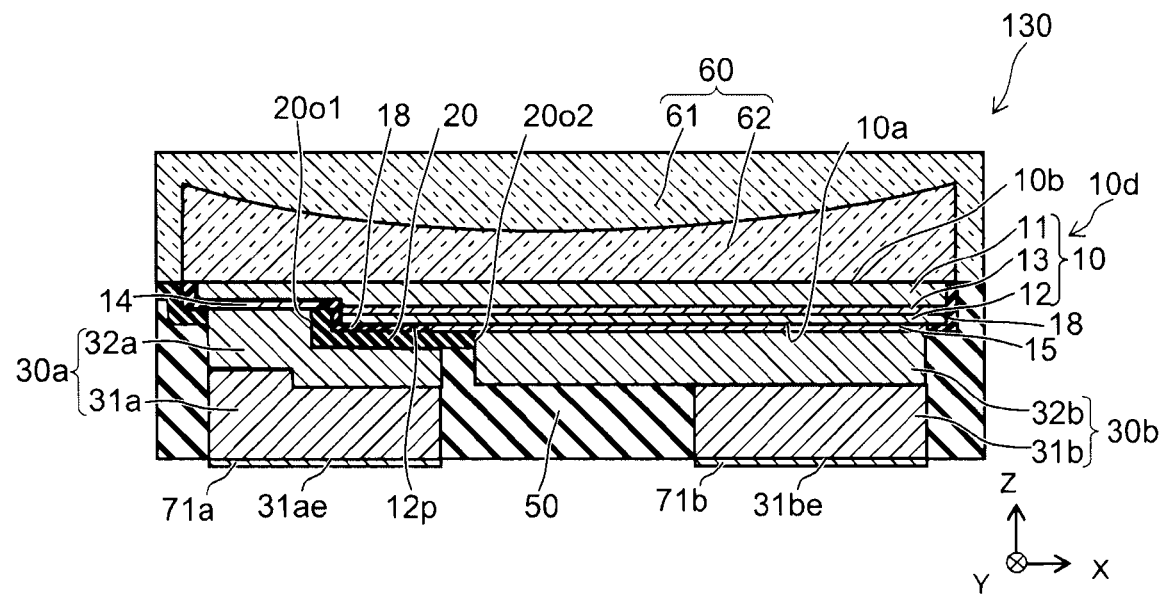
FIG. 10 is a schematic cross-sectional view illustrating the configuration of a semiconductor light emitting device according to a third embodiment.

FIG. 10 is a schematic cross-sectional view illustrating the configuration of a semiconductor light emitting device according to a third embodiment.

Namely, this drawing is a cross-sectional view corresponding to the cross section along line A-A' of FIG. 1B.

In the semiconductor light emitting device 130 according to this embodiment as illustrated in FIG. 10, the first conductive member 30*a* further includes a first surface layer 71*a* provided on the first end surface 31*ae* of the first conductive member 30*a* on the side opposite to the semiconductor stacked body 10; and the second conductive member 30*b* further includes a second surface layer 71*b* provided on the second end surface 31*be* of the second conductive member 30*b* on the side opposite to the semiconductor stacked body 10. Otherwise, the semiconductor light emitting device 130 may be similar to the semiconductor light emitting device 110, and a description is omitted.

The first surface layer 71*a* has, for example, a wettability higher than the wettability of the material of the first columnar portion 31*a*. The second surface layer 71*b* has, for example, a wettability higher than the wettability of the material of the second columnar portion 31*b*. The first surface layer 71*a* and the second surface layer 71*b* also may have the function of an oxidation prevention layer.

The first surface layer 71*a* and the second surface layer 71*b* may include, for example, a layer on which at least one processing selected from water-soluble preflux, electroless Ni/Au plating, and AuSn plating is performed. Thereby, the wettability of the solder with the first end surface 31*ae* of the first conductive member 30*a* and the second end surface 31*be* of the second conductive member 30*b* can be increased. Thereby, the mountability of the semiconductor light emitting device 130 improves.

Figure 11:
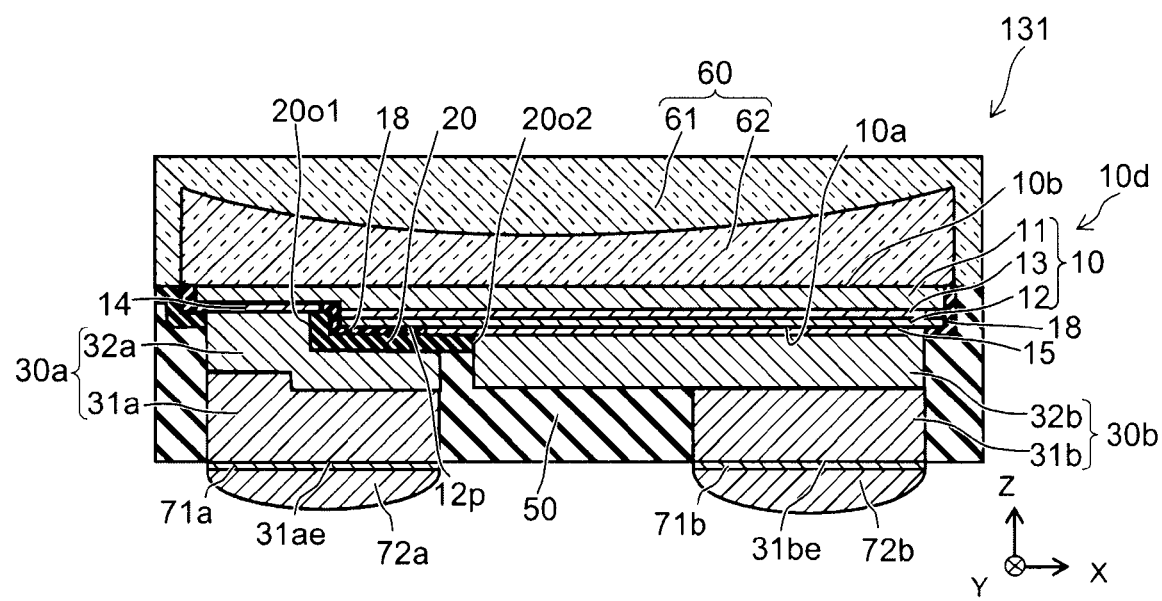
FIG. 11 is a schematic cross-sectional view illustrating the configuration of another semiconductor light emitting device according to the third embodiment.

FIG. 11 is a schematic cross-sectional view illustrating the configuration of another semiconductor light emitting device according to the third embodiment.

Namely, this drawing is a cross-sectional view corresponding to the cross section along line A-A' of FIG. 1B.

As illustrated in FIG. 11, the semiconductor light emitting device 131 according to this embodiment further includes a first connection member 72*a* provided on the first end surface 31*ae* of the first conductive member 30*a* on the side opposite to the semiconductor stacked body 10 and a second connection member 72*b* provided on the second end surface 31*be* of the second conductive member 30*b* on the side opposite to the semiconductor stacked body 10. Otherwise, the semiconductor light emitting device 131 may be similar to the semiconductor light emitting device 110, and a description is omitted.

Although the first conductive member 30*a* includes the first surface layer 71*a* and the second conductive member 30*b* includes the second surface layer 71*b* in this specific example, the first surface layer 71*a* and the second surface layer 71*b* may be provided if necessary and may be omitted in some cases.

The first connection member 72*a* and the second connection member 72*b* may include solder. The mountability of the semiconductor light emitting device 131 is improved further by providing the first connection member 72a and the second connection member 72b in the semiconductor light emitting device 131.

The first surface layer 71a, the second surface layer 71b, the first connection member 72a, and the second connection member 72b recited above may be provided in the semiconductor light emitting device according to any of the embodiments described above; and similar effects can be realized.

Fourth Embodiment

Figure 12:
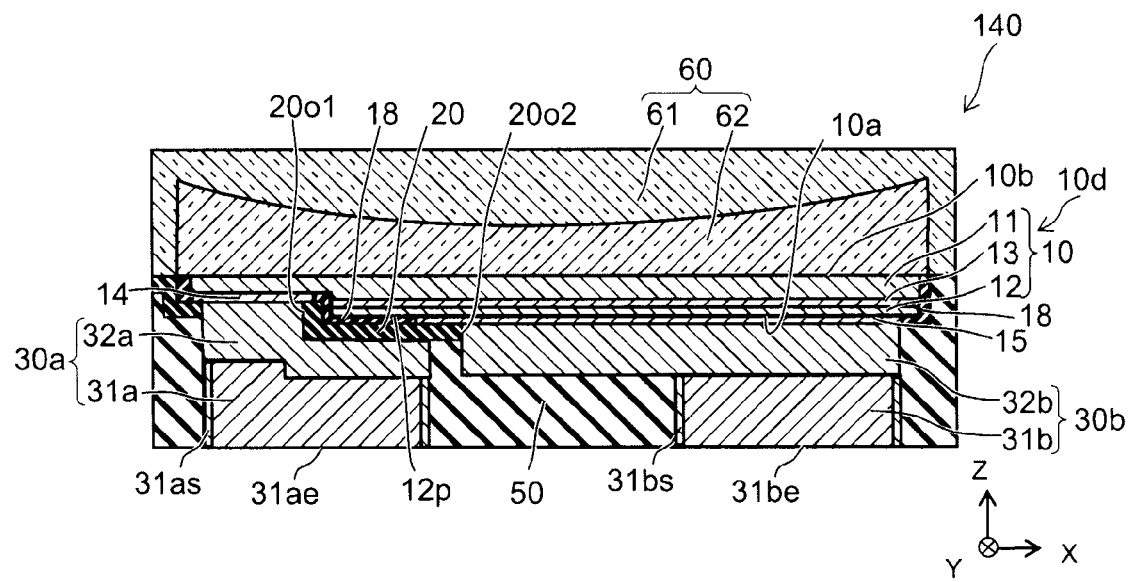
FIG. 12 is a schematic cross-sectional view illustrating the configuration of a semiconductor light emitting device according to a fourth embodiment.

FIG. 12 is a schematic cross-sectional view illustrating the configuration of a semiconductor light emitting device according to a fourth embodiment.

Namely, this drawing is a cross-sectional view corresponding to the cross section along line A-A' of FIG. 1B.

In the semiconductor light emitting device 140 according to this embodiment as illustrated in FIG. 12, the first columnar portion 31a of the first conductive member 30a includes a first surface-roughened portion 31as provided in the side surface of the first columnar portion 31a. The second columnar portion 31b of the second conductive member 30b includes a second surface-roughened portion 31bs provided in the side surface of the second columnar portion 31b. Otherwise, the semiconductor light emitting device 140 may be similar to the semiconductor light emitting device 110, and a description is omitted.

The first surface-roughened portion 31as and the second surface-roughened portion 31bs can be formed by, for example, performing soft etching on the side surface of the first columnar portion 31a and the side surface of the second columnar portion 31b after removing the first resist layer 37 and the second resist layer 38 in the process described in regard to FIG. 3D. A hydrogen peroxide-sulfuric acid-based soft etchant, for example, may be used in such soft etching.

Also, the first surface-roughened portion 31as and the second surface-roughened portion 31bs may be formed by, for example, roughening the side surface of the second resist layer 38 in the process described in regard to FIG. 3C and by transferring the unevenness of the roughened side surface of the second resist layer 38 onto the columnar portion conductive film 31f.

The adhesion between the first columnar portion 31a and the sealing member 50 and the adhesion between the second columnar portion 31b and the sealing member 50 can be improved and the reliability can be increased by providing the first surface-roughened portion 31as in the side surface of the first columnar portion 31a and the second surface-roughened portion 31bs in the side surface of the second columnar portion 31b.

The first surface-roughened portion 31as and the second surface-roughened portion 31bs may be provided in the semiconductor light emitting device according to any of the embodiments described above; and similar effects can be realized.

Fifth Embodiment

Figure 13:
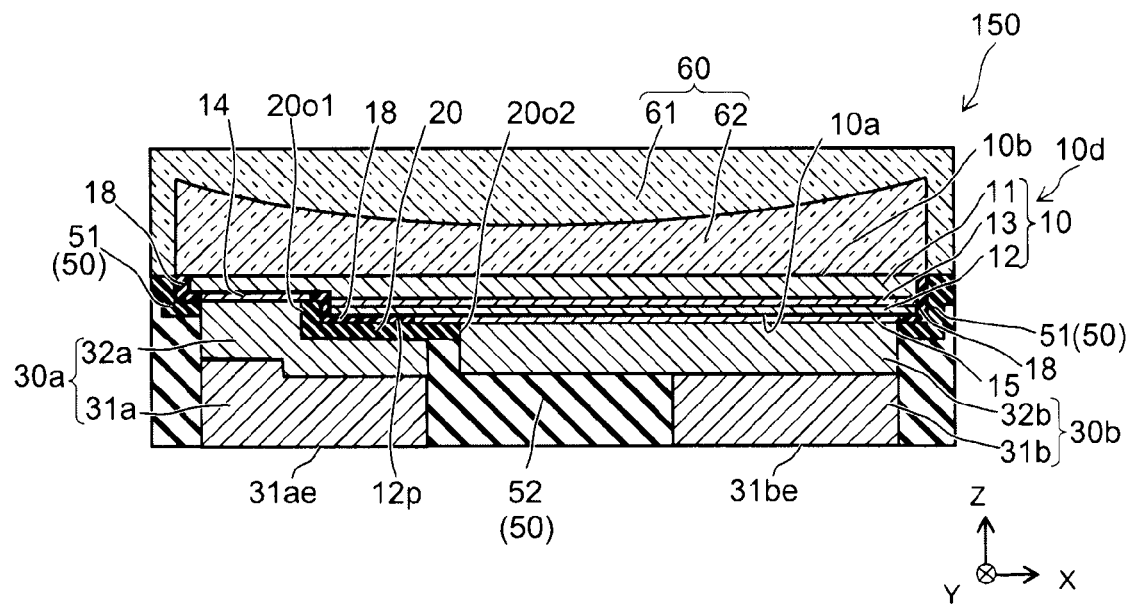
FIG. 13 is a schematic cross-sectional view illustrating the configuration of a semiconductor light emitting device according to a fifth embodiment.

FIG. 13 is a schematic cross-sectional view illustrating the configuration of a semiconductor light emitting device according to a fifth embodiment.

Namely, this drawing is a cross-sectional view corresponding to the cross section along line A-A' of FIG. 1B.

In the semiconductor light emitting device 150 according to this embodiment as illustrated in FIG. 13, the sealing member 50 has a two-layer structure in a region where the semiconductor stacked body 10 is not provided.

In other words, the sealing member 50 has a portion including a first sealing layer 51 and a second sealing layer 52. A distance between the second sealing layer 52 and the optical layer 60 is longer than a distance between the first sealing layer 51 and the optical layer 60. The first sealing layer 51 may include a material different from the material of the second sealing layer 52.

For example, the first sealing layer 51 may have a heat resistance higher than the heat resistance of the second sealing layer 52. In other words, the thermal decomposition temperature of the first sealing layer 51 is higher than the thermal decomposition temperature of the second sealing layer 52. For example, the first sealing layer 51 may include a polyimide having a thermal decomposition temperature not less than about 380° C.; and the second sealing layer 52 may include, for example, an epoxy resin having a thermal decomposition temperature not less than about 280° C. and not more than about 300° C.

The content ratio of the filler included in the first sealing layer 51 may be set to be lower than the content ratio of the filler included in the second sealing layer 52. For example, the first sealing layer 51 may include a polyimide that substantially does not include a filler. On the other hand, the second sealing layer 52 may include an epoxy resin including a filler.

The first sealing layer 51 may include, for example, the same material as the insulating layer 20; and the first sealing layer 51 and the insulating layer 20 can be formed collectively.

As described above, there are cases where portions inside the sealing member 50 proximal to the semiconductor stacked body 10 reach high temperatures in regions between the semiconductor stacked bodies 10 in the process of separating the substrate 10s from the semiconductor stacked body 10. In other words, the sealing member 50 of the regions between the semiconductor stacked bodies 10 is heated and the portions of the sealing member 50 proximal to the semiconductor stacked body 10 in particular reach high temperatures when irradiating the laser light from the surface of the substrate 10s on the side opposite to the semiconductor stacked body 10 through the substrate 10s onto the semiconductor stacked body 10. In such a case, the degradation of the characteristics of the sealing member 50 due to the heating can be suppressed by the sealing member 50 having a two-layer structure and the heat resistance of the first sealing layer 51 being higher than that of the second sealing layer 52.

The occurrence of defects caused by the filler due to the sealing member 50 reaching a high temperature can be suppressed by setting the content ratio of the filler included in the first sealing layer 51 to be lower than the content ratio of the filler included in the second sealing layer 52.

The stacked configuration of the first sealing layer 51 and the second sealing layer 52 may be provided in the semiconductor light emitting device according to any of the embodiments described above; and similar effects can be realized.

Sixth Embodiment

Figure 14A:
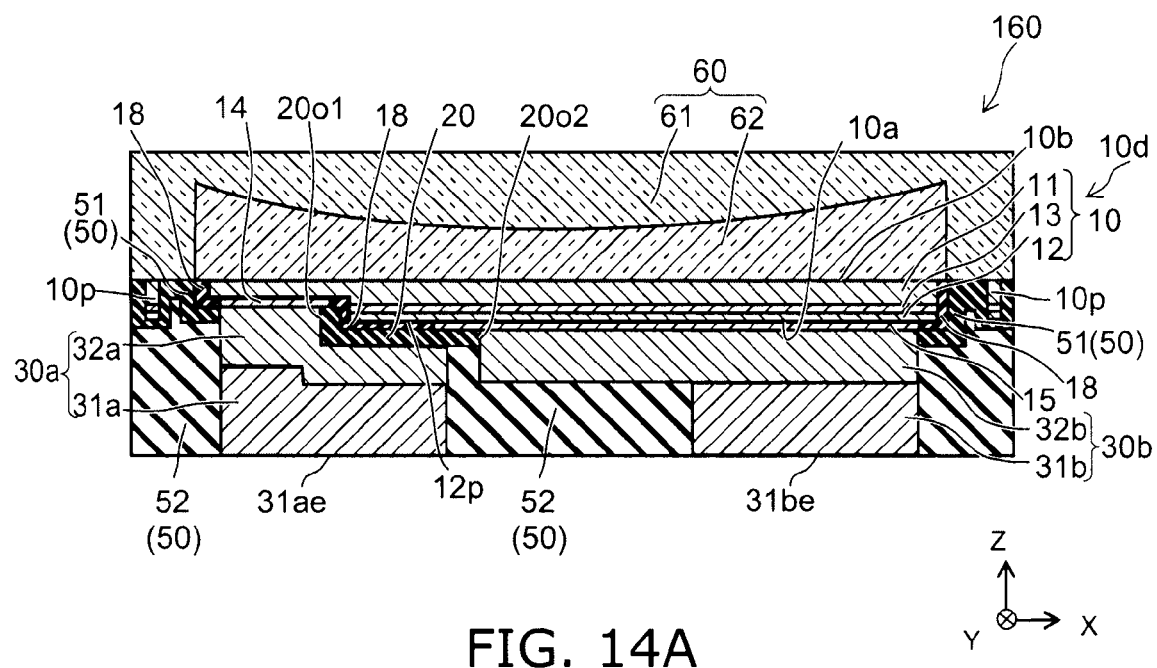
FIG. 14A and FIG. 14B are schematic views illustrating the configuration of a semiconductor light emitting device according to a sixth embodiment.
Figure 14B:
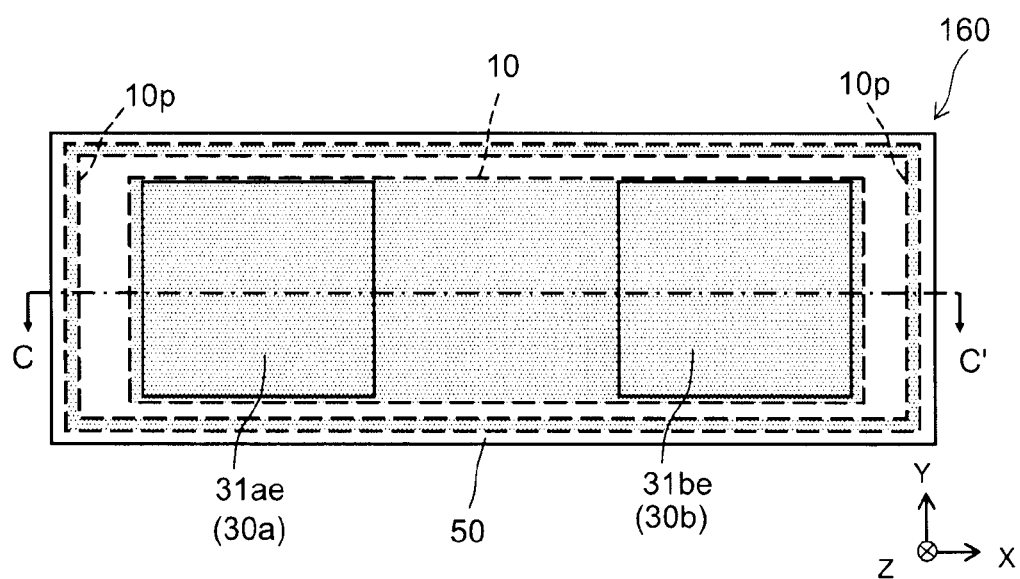

FIG. 14A and FIG. 14B are schematic views illustrating the configuration of a semiconductor light emitting device according to a sixth embodiment.

Namely, FIG. 14B is a schematic plan view; and FIG. 14A is a cross-sectional view along line C-C' of FIG. 14B.

As illustrated in FIG. 14A and FIG. 14B, the semiconductor light emitting device 160 according to this embodiment further includes a peripheral stacked unit 10p provided in the X-Y plane (the plane perpendicular to the Z-axis direction which is the direction from the second major surface 10a toward the first major surface 10b) to oppose at least one side of the semiconductor stacked body.

The peripheral stacked unit 10p is made of the material of the semiconductor stacked body 10. The peripheral stacked unit 10p is covered with the sealing member 50 and the optical layer 60.

In this specific example, the peripheral stacked unit 10p is provided in the X-Y plane to oppose four sides of the semiconductor stacked body 10. In other words, the peripheral stacked unit 10p encloses the semiconductor stacked body 10 in the X-Y plane. In this specific example, the pattern configuration of the peripheral stacked unit 10p is an annular configuration.

Providing the peripheral stacked unit 10p can reduce, for example, the stress applied to the semiconductor stacked body 10 when separating each of the multiple semiconductor stacked bodies 10 by, for example, the dicing described in regard to FIG. 4E. In other words, the impact during the dicing is absorbed by the peripheral stacked unit 10p; and the application of the impact to the semiconductor stacked body 10 can be suppressed. Thereby, the occurrence of defects in the semiconductor layers of the semiconductor stacked body 10 can be suppressed; and a high luminous efficiency can be maintained.

Although this specific example is an example in which the peripheral stacked unit 10p encloses the semiconductor stacked body 10 in the X-Y plane, the embodiment is not limited thereto. The pattern configuration of the peripheral stacked unit 10p is arbitrary. For example, the peripheral stacked unit 10p may have a pattern configuration of four band configurations divided to oppose the four sides of the semiconductor stacked body 10, respectively. It is unnecessary for the peripheral stacked unit 10p to be provided to oppose all of the sides of the semiconductor stacked body 10; and it is sufficient for the peripheral stacked unit 10p to be provided opposing at least one side of the semiconductor stacked body 10. It is unnecessary for the peripheral stacked unit 10p to be provided along the entire length of the at least one side of the semiconductor stacked body 10; and it is sufficient for the peripheral stacked unit 10p to be provided opposing at least a portion of the at least one side of the semiconductor stacked body 10.

Such a peripheral stacked unit 10p may be provided in the semiconductor light emitting device according to any of the embodiments described above; and similar effects can be realized.

Seventh Embodiment

Figure 15:
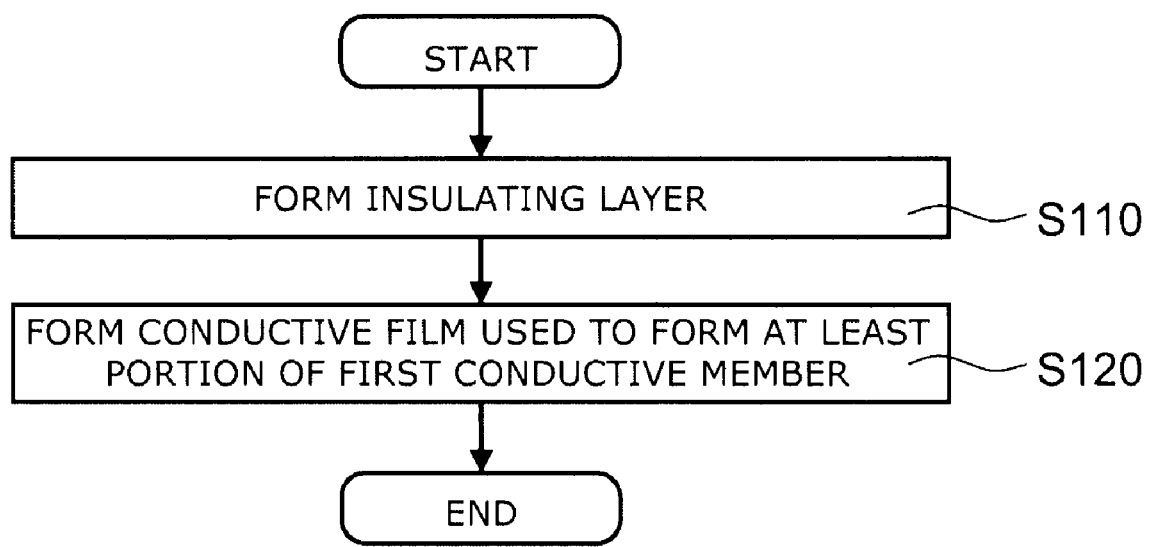
FIG. 15 is a flowchart illustrating a method for manufacturing a semiconductor light emitting device according to a seventh embodiment.

FIG. 15 is a flowchart illustrating a method for manufacturing a semiconductor light emitting device according to a seventh embodiment.

This embodiment is a method of manufacturing any of the semiconductor light emitting devices according to the embodiments recited above. Namely, this manufacturing method is a method for manufacturing a semiconductor light emitting device, where the device includes the light emitting unit 10d, the first conductive member 30a, the insulating layer 20, the second conductive member 30b, the sealing member 50, and the optical layer 60, the light emitting unit 10d includes the semiconductor stacked body 10, the first electrode 14, and the second electrode 15, the semiconductor stacked body 10 includes the first semiconductor layer 11 of the first conductivity type, the second semiconductor layer 12 of the second conductivity type, and the light emitting layer 13 provided between the first semiconductor layer 11 and the second semiconductor layer 12, the semiconductor stacked body 10 includes the first major surface 10b on the first semiconductor layer 11 side and the second major surface 10a on the second semiconductor layer 12 side, the first electrode 14 is electrically connected to the first semiconductor layer 11 on the second major surface 10a side, the second electrode 15 is electrically connected to the second semiconductor layer 12 on the second major surface 10a side, the first conductive member 30a is electrically connected to the first electrode 14, the first conductive member 30a includes the first columnar portion 31a provided on the second major surface 10a to cover the certain portion 12p of the second semiconductor layer 12 on the second major surface 10a side, the first columnar portion 31a is separate from the second semiconductor layer 12, the insulating layer 20 is provided between the first columnar portion 31a and the certain portion 12p of the second semiconductor layer 12 on the second major surface 10a side, the second conductive member 30b is electrically connected to the second electrode 15, the second conductive member 30b includes the second columnar portion 31b provided on the second major surface 10a, the sealing member 50 covers the side surface of the first conductive member 30a and the side surface of the second conductive member 30b, the optical layer 60 is an optical layer provided on the first major surface 10b of the semiconductor stacked body 10, and the optical layer 60 includes a wavelength conversion unit (the fluorescer layer 61) configured to absorb emitted light emitted from the light emitting layer 13 and emit light having a wavelength different from a wavelength of the emitted light.

As illustrated in FIG. 15, the method for manufacturing the semiconductor light emitting device according to this embodiment forms the insulating layer 20 covering the certain portion 12p of the second semiconductor layer 12 on the second major surface 10a side (step S110). In other words, the processing described in regard to, for example, FIG. 2C is performed.

As described above, the insulating layer 20 may be formed in a region excluding at least a portion of the first electrode 14 and a region excluding at least a portion of the second electrode 15. The insulating layer 20 may be provided also between the multiple semiconductor stacked bodies 10.

Then, as illustrated in FIG. 15, a conductive film used to form at least a portion of the first conductive member 30a is formed on the insulating layer 20 covering the certain portion 12p of the second semiconductor layer 12 on the second major surface 10a side (step S120). In other words, the processing described in regard to, for example, FIG. 2D, FIG. 2E, and FIG. 3A is performed.

In other words, step S120 may include, for example, the process of forming the seed layer 33, the process of forming the first resist layer 37 in a region other than the region corresponding to the first connection portion 32a and the region corresponding to the second connection portion 32b, and the process of forming the connection portion conductive film 32f used to form the second layer of the first connection portion 32a and the fourth layer of the second connection portion 32b in a region where the first resist layer 37 is not provided.

As described above, the conductive film used to form at least a portion of the first conductive member 30a also may be used to form at least a portion of the second conductive member 30b. This conductive film also may be formed to cover at least a portion of the first electrode 14 not covered with the insulating layer 20 and at least a portion of the second electrode 15 not covered with the insulating layer 20.

Thereby, high electrode connectability can be maintained; and a semiconductor light emitting device suited to downsizing can be manufactured.

As described above, the formation of the insulating layer recited above (step S110) and the formation of the conductive film recited above (step S120) can be implemented collectively for the multiple semiconductor stacked bodies 10 of the substrate 10s on which the multiple semiconductor stacked bodies 10 are provided. Thereby, high electrode connectability can be maintained; and a semiconductor light emitting device suited to downsizing can be manufactured with high productivity.

The manufacturing method according to this embodiment may further include the process of forming the first columnar portion 31a on the conductive film (the first connection portion 32a) used to form at least a portion of the first conductive member 30a, where the conductive film is formed on the insulating layer 20 covering the certain portion 12p of the second semiconductor layer 12 on the second major surface 10a side. In other words, the processing described in regard to FIG. 3B and FIG. 3C also may be implemented.

In the case where the connection portion conductive film 32f is omitted as in the semiconductor light emitting devices 110d, 110e, and 110f described in regard to FIG. 6A to FIG. 6C, the process of forming the conductive film used to form at least a portion of the first conductive member 30a on the insulating layer 20 covering the certain portion 12p of the second semiconductor layer 12 on the second major surface 10a side of step S120 becomes a process of forming the first columnar portion 31a on the insulating layer 20 covering the certain portion 12p of the second semiconductor layer 12 on the second major surface 10a side. By this method as well, high electrode connectability can be maintained; and a semiconductor light emitting device suited to downsizing can be manufactured.

Red fluorescers may include, for example, the following. However, the red fluorescer of the embodiments is not limited to the following:

$Y_2O_2S:Eu$
$Y_2O_2S:Eu+pigment$
$Y_2O_3:Eu$
$Zn_3(PO_4)_2:Mn$
$(Zn, Cd)S:Ag+In_2O_3$
$(Y, Gd, Eu)BO_3$
$(Y, Gd, Eu)_2O_3$
$YVO_4:Eu$
$La_2O_2S:Eu, Sm$
$LaSi_3N_5:Eu^{2+}$
$\alpha\text{-sialon}:Eu^{2+}$
$CaAlSiN_3:Eu^{2+}$
$CaSiN_x:Eu^{2+}$
$CaSiN_x:Ce^{2+}$
$M_2Si_5N:Eu^{2+}$
$CaAlSiN_3:Eu^{2+}$
$(SrCa)AlSiN_3:Eu^{x+}$
$Sr_x(Si_yAl_3)_z(O_xN):Eu^{x+}$ Green fluorescers may include, for example, the following. However, the green fluorescer of the embodiments is not limited to the following:

$ZnS:Cu, Al$
$ZnS:Cu, Al+pigment$
$(Zn, Cd)S:Cu, Al$
$ZnS:Cu, Au, Al, +pigment$
$Y_3Al_5O_{12}:Tb$
$Y_3(Al, Ga)_5O_{12}:Tb$
$Y_2SiO_5:Tb$
$Zn_2SiO_4:Mn$
$(Zn, Cd)S:Cu$
$ZnS:Cu$
$Zn_2SiO_4:Mn$
$ZnS:Cu+Zn_2SiO_4:Mn$
$Gd_2O_2S:Tb$
$(Zn, Cd)S:Ag$
$ZnS:Cu, Al$
$Y_2O_2S:Tb$
$ZnS:Cu, Al+In_2O_3$
$(Zn, Cd)S:Ag+In_2O_3$
$(Zn, Mn)_2SiO_4$
$BaAl_{12}O_{19}:Mn$
$(Ba, Sr, Mg)O.aAl_2O_3:Mn$
$LaPO_4:Ce, Tb$
$Zn_2SiO_4:Mn$
$ZnS:Cu$
$3(Ba, Mg, Eu, Mn)O.8Al_2O_3$
$La_2O_3.0.2SiO_2.0.9P_2O_5:Ce, Tb$
$CeMgAl_{11}O_{19}:Tb$
$CaSc_2O_4:Ce$
$(BrSr)SiO_4:Eu$
$\alpha\text{-sialon}:Yb^{2+}$
$\beta\text{-sialon}:Eu^{2+}$
$(SrBa)YSi_4N_7:Eu^{2+}$
$(CaSr)Si_2O_4N_7:Eu^{2+}$
$Sr(SiAl)(ON):Ce$ Blue fluorescers may include, for example, the following. However, the blue fluorescer of the embodiments is not limited to the following:

$ZnS:Ag$
$ZnS:Ag+pigment$
$ZnS:Ag, Al$
$ZnS:Ag, Cu, Ga, Cl$
$ZnS:Ag+In_2O_3$
$ZnS:Zn+In_2O_3$
$(Ba, Eu)MgAl_{10}O_{17}$
$(Sr, Ca, Ba, Mg)_{10}(PO_4)6Cl_2:Eu$
$Sr_{10}(PO_4)6Cl_2:Eu$
$(Ba, Sr, Eu)(Mg, Mn)Al_{10}O_{17}$
$10(Sr, Ca, Ba, Eu).6PO_4.Cl_2$
$BaMg_2Al_{16}O_{25}:Eu$ Yellow fluorescers may include, for example, the following. However, the yellow fluorescer of the embodiments is not limited to the following:

$Li(Eu, Sm)W_2O_8$
$(Y, Gd)_3, (Al, Ga)_5O_{12}:Ce^{3+}$
$Li_2SrSiO_4:Eu^{2+}$
$(Sr(Ca, Ba))_3SiO_5:Eu^{2+}$
$SrSi_2ON_{2.7}:Eu^{2+}$

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the compositional proportions x, y, and z are changed within the ranges respectively. "Nitride semiconductor" further includes group V elements other than N (nitrogen) in the chemical formula recited above and any of various dopants added to control the conductivity type, etc.

According to the embodiments as described above, high electrode connectability can be maintained; and a semiconductor light emitting device suited to downsizing and a method for manufacturing the same can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in light emitting units such as semiconductor layers, light emitting layers, electrodes, conductive layers, reflective layers, and contact electrode layers and components included in semiconductor light emitting devices such as conductive members, columnar portions, connection portions, insulating layers, sealing members, sealing layers, optical layers, wavelength conversion units, fluorescer layers, fluorescers, transparent members, hard films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices and methods for manufacturing semiconductor light emitting devices practicable by an appropriate design modification by one skilled in the art based on the semiconductor light emitting devices and the methods for manufacturing the semiconductor light emitting devices described above as embodiments of the invention also are within the scope of the invention to the extent that the purport of the embodiments of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device, comprising:
a light emitting unit including
a semiconductor stacked body including a first semiconductor layer of a first conductivity type, a second semiconductor layer of a second conductivity type, and a light emitting layer provided between the first semiconductor layer and the second semiconductor layer, the semiconductor stacked body having a first major surface on a first semiconductor layer side and a second major surface on a second semiconductor layer side;
a first electrode electrically connected to the first semiconductor layer on a second major surface side, and
a second electrode electrically connected to the second semiconductor layer on the second major surface side;
a first conductive member electrically connected to the first electrode, the first conductive member including a first columnar portion provided on the second major surface to cover a portion of the second semiconductor layer on the second major surface side, the first columnar portion being separate from the second semiconductor layer;
an insulating layer provided between the first columnar portion and the portion of the second semiconductor layer on the second major surface side;
a second conductive member electrically connected to the second electrode, the second conductive member including a second columnar portion provided on the second major surface;
a sealing member covering a side surface of the first conductive member and a side surface of the second conductive member; and
an optical layer provided on the first major surface of the semiconductor stacked body, the optical layer including a wavelength conversion unit configured to absorb an emitted light emitted from the light emitting layer and emit light having a wavelength different from a wavelength of the emitted light;
wherein the first conductive member further includes a first connection portion covering at least a portion of the insulating layer to electrically connect the first electrode to the first columnar portion.

2. The device according to claim 1, wherein the first connection portion includes at least one selected from Cu (copper), Ni (nickel), and Al (aluminum).

3. The device according to claim 1, wherein the second conductive member further includes a second connection portion having a portion extending along a plane perpendicular to a direction from the second major surface toward the first major surface to electrically connect the second electrode to the second columnar portion.

4. The device according to claim 1, wherein a first end surface on a side of the first conductive member opposite to the semiconductor stacked body and a second end surface on a side of the second conductive member opposite to the semiconductor stacked body are asymmetrical.

5. The device according to claim 1, wherein the first conductive member further includes a first surface layer provided on a first end surface on a side of the first conductive member opposite to the semiconductor stacked body, the first surface layer having a wettability higher than a wettability of a material of the first columnar portion.

6. The device according to claim 5, wherein the first surface layer includes a layer, and at least one processing selected from water-soluble preflux, electroless Ni/Au plating, and AuSn plating is performed on the layer.

7. The device according to claim 1, wherein the first columnar portion has a first surface-roughened portion provided in a side surface of the first columnar portion.

8. The device according to claim 1, wherein
the sealing member has a portion including a first sealing layer and a second sealing layer, a distance between the second sealing layer and the optical layer being longer than a distance between the first sealing layer and the optical layer,
the first sealing layer having a heat resistance higher than a heat resistance of the second sealing layer.

9. The device according to claim 1, further comprising a peripheral stacked unit provided opposing at least one side of the semiconductor stacked body in a plane perpendicular to a direction from the second major surface toward the first major surface, the peripheral stacked unit being made of a material of the semiconductor stacked body and being covered with the sealing member and the optical layer.

10. The device according to claim 1, wherein the optical layer includes a fluorescer layer and a hard film, the fluorescer layer including a fluorescer, the hard film being provided on a side of the fluorescer layer opposite to the semiconductor stacked body and having a hardness higher than a hardness of the fluorescer layer.

11. The device according to claim 1, wherein the first columnar portion and the second columnar portion include at least one selected from Cu (copper), Ni (nickel), and Al (aluminum).

12. The device according to claim 1, wherein the sealing member includes an epoxy resin containing at least one selected from a quartz filler and an alumina filler.

13. The device according to claim 1, wherein the insulating layer includes at least one selected from polyimide and polybenzoxazole.

14. The device according to claim 1, wherein a length of the first semiconductor layer along a direction from the first columnar portion toward the second columnar portion is longer than a length of the first semiconductor layer along a direction orthogonal to the direction from the first columnar portion toward the second columnar portion and a direction from the second major surface toward the first major surface.

15. The device according to claim 1, wherein a portion of the first semiconductor layer at the second major surface of the semiconductor stacked body is exposed by a portion of the second semiconductor layer and a portion of the light emitting layer being selectively removed, and the first electrode is provided on the exposed portion of the first semiconductor layer.

16. The device according to claim 1, wherein the first conductivity type is an n type and the second conductivity type is a p type.

17. The device according to claim 1, wherein a thermal decomposition temperature of the insulating layer is higher than a thermal decomposition temperature of the sealing member.

18. A method for manufacturing a semiconductor light emitting device, the semiconductor light emitting device including a light emitting unit, a first conductive member, an insulating layer, a second conductive member, a sealing member, and an optical layer, the light emitting unit including a semiconductor stacked body, a first electrode, and a second electrode, the semiconductor stacked body including a first semiconductor layer of a first conductivity type, a second semiconductor layer of a second conductivity type, and a light emitting layer provided between the first semiconductor layer and the second semiconductor layer, the semiconductor stacked body having a first major surface on a first semiconductor layer side and a second major surface on a second semiconductor layer side, the first electrode being electrically connected to the first semiconductor layer on a second major surface side, the second electrode being electrically connected to the second semiconductor layer on the second major surface side, the first conductive member being electrically connected to the first electrode, the first conductive member including a first columnar portion provided on the second major surface to cover a portion of the second semiconductor layer on the second major surface side, the first columnar portion being separate from the second semiconductor layer, the insulating layer being provided between the first columnar portion and the portion of the second semiconductor layer on the second major surface side, the second conductive member being electrically connected to the second electrode and including a second columnar portion provided on the second major surface, the sealing member covering a side surface of the first conductive member and a side surface of the second conductive member, the optical layer being provided on the first major surface of the semiconductor stacked body and including a wavelength conversion unit configured to absorb an emitted light emitted from the light emitting layer and emit light having a wavelength different from a wavelength of the emitted light, the method comprising:
- forming the insulating layer to cover the portion of the second semiconductor layer on the second major surface side; and
- forming a conductive film on the insulating layer covering the portion of the second semiconductor layer on the second major surface side, the conductive film being used to form at least a portion of the first conductive member;
- wherein the forming the insulating layer and the forming of the conductive film are implemented collectively for a plurality of the semiconductor stacked bodies provided on a substrate.

* * * * *